US011953600B2

(12) United States Patent
Pacala

(10) Patent No.: US 11,953,600 B2
(45) Date of Patent: Apr. 9, 2024

(54) SYNCHRONIZED IMAGE CAPTURING FOR ELECTRONIC SCANNING LIDAR SYSTEMS COMPRISING AN EMITTER CONTROLLER AND PLURAL SENSOR CONTROLLERS

(71) Applicant: Ouster, Inc., San Francisco, CA (US)

(72) Inventor: Angus Pacala, San Francisco, CA (US)

(73) Assignee: Ouster, Inc., San Francisco, CA (US)

( * ) Notice: Subject to any disclaimer, the term of this patent is extended or adjusted under 35 U.S.C. 154(b) by 404 days.

(21) Appl. No.: 17/473,736

(22) Filed: Sep. 13, 2021

(65) Prior Publication Data
US 2022/0120906 A1    Apr. 21, 2022

Related U.S. Application Data

(63) Continuation of application No. PCT/US2020/032511, filed on May 12, 2020.
(Continued)

(51) Int. Cl.
*G01S 7/484*    (2006.01)
*G01S 7/4863*   (2020.01)
(Continued)

(52) U.S. Cl.
CPC ............ *G01S 17/86* (2020.01); *G01S 7/484* (2013.01); *G01S 7/4863* (2013.01); *G01S 17/42* (2013.01); *H03K 3/42* (2013.01); *H04N 25/44* (2023.01)

(58) Field of Classification Search
CPC .......... G01S 17/02; G01S 17/04; G01S 17/06; G01S 7/48; G01S 17/86; G01S 17/50;
(Continued)

(56) References Cited

U.S. PATENT DOCUMENTS 8,648,702 B2   2/2014 Pala
9,992,477 B2   6/2018 Pacala et al.
(Continued)

FOREIGN PATENT DOCUMENTS

JP    2010071976 A    4/2010
JP    2013207415 A    10/2013
(Continued)

OTHER PUBLICATIONS

JP2021-568199, "Office Action", dated Dec. 4, 2023, 8 pages.
(Continued)

*Primary Examiner* — Que Tan Le
(74) *Attorney, Agent, or Firm* — Kilpatrick Townsend & Stockton LLP

(57) ABSTRACT

Embodiments describe an electronically scanning optical system including an emitter array configured to emit light into a field, a time of flight (TOF) sensor array configured to detect emitted light reflected back from the field, an image sensor array configured to detect ambient light in the field, where a field of view of the emitter array corresponds to a field of view of the TOF sensor array and at least a subset of a field of view of the image sensor array. The optical system further including an emitter controller configured to activate a subset of the plurality of light emitters at a time, a TOF sensor controller configured to synchronize the readout of individual TOF photosensors concurrently with the firing of corresponding light emitters, and an image sensor controller configured to capture an image that is representative of the field during the emission cycle.

20 Claims, 10 Drawing Sheets

Related U.S. Application Data

(60) Provisional application No. 62/847,208, filed on May 13, 2019.

(51) Int. Cl.
  *G01S 17/42* (2006.01)
  *G01S 17/86* (2020.01)
  *H03K 3/42* (2006.01)
  *H04N 25/44* (2023.01)

(58) Field of Classification Search
  CPC .......... G01S 17/42; G01S 17/88; G01S 17/89; H04N 25/70; H04N 25/00
  USPC .................................. 250/214 R, 221, 208.1
  See application file for complete search history.

(56) References Cited

U.S. PATENT DOCUMENTS

| | | |
|---|---|---|
| 10,444,359 B2 | 10/2019 | Pacala |
| 10,527,725 B2 | 1/2020 | Pacala |
| 10,809,380 B2 | 10/2020 | Pacala |
| 10,983,197 B1 * | 4/2021 | Zhu .......................... G01S 7/484 |
| 11,016,192 B2 | 5/2021 | Pacala |
| 11,016,193 B2 | 5/2021 | Pacala |
| 11,187,802 B2 | 11/2021 | Pacala et al. |
| 2015/0219764 A1 | 8/2015 | Lipson |
| 2018/0020179 A1 | 1/2018 | Wan |
| 2018/0020209 A1 | 1/2018 | Ko et al. |
| 2018/0329066 A1 | 11/2018 | Pacala |
| 2019/0011561 A1 | 1/2019 | Pacala et al. |
| 2019/0011562 A1 | 1/2019 | Pacala et al. |
| 2020/0041646 A1 | 2/2020 | Pacala et al. |
| 2020/0209355 A1 | 7/2020 | Pacala et al. |
| 2021/0318434 A1 | 10/2021 | Pacala et al. |

FOREIGN PATENT DOCUMENTS

| | | |
|---|---|---|
| JP | 2018152632 A | 9/2018 |
| WO | 2019010320 A1 | 1/2019 |

OTHER PUBLICATIONS

EP20805372.8, "Extended European Search Report", dated Apr. 19, 2023, 11 pages.
Application No. PCT/US2020/032511, International Preliminary Report on Patentability, dated Nov. 25, 2021, 14 pages.
PCT/US2020/032511, "International Search Report and Written Opinion", dated Aug. 17, 2020, 15 pages.

* cited by examiner

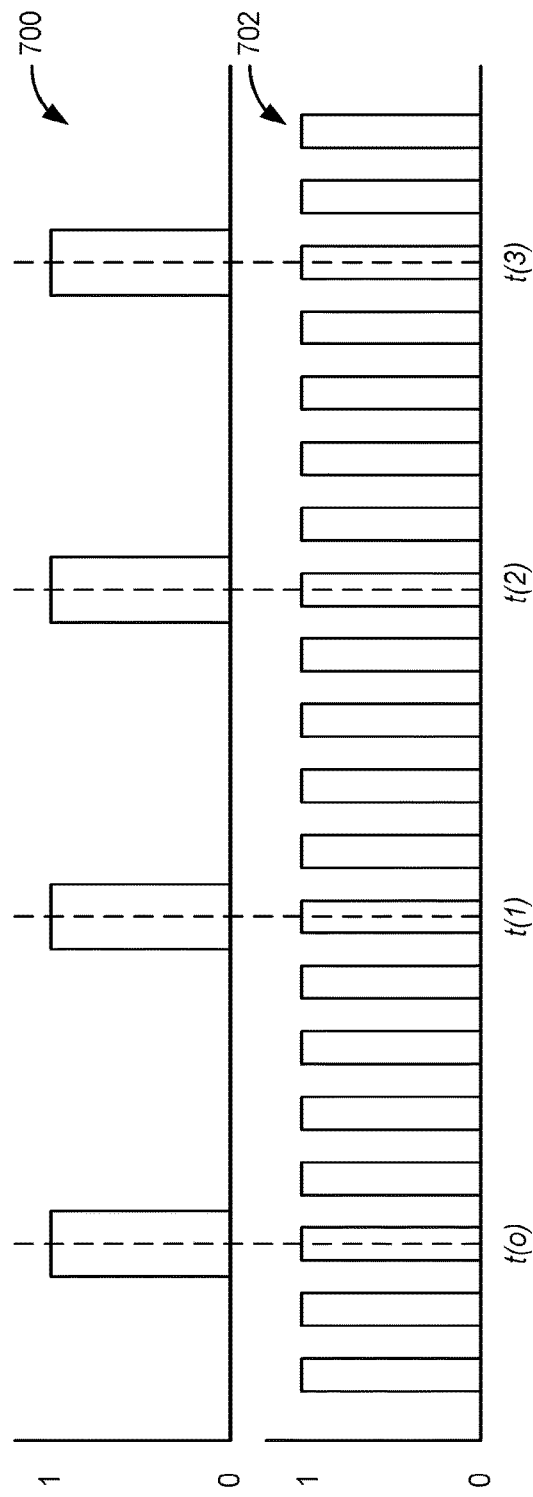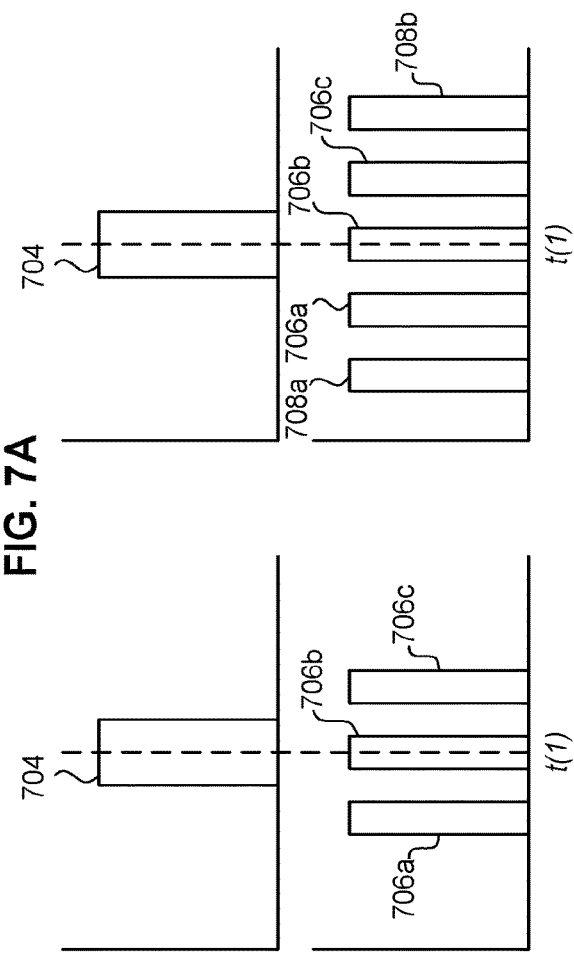
FIG. 7A
FIG. 7B
FIG. 7C

SYNCHRONIZED IMAGE CAPTURING FOR ELECTRONIC SCANNING LIDAR SYSTEMS COMPRISING AN EMITTER CONTROLLER AND PLURAL SENSOR CONTROLLERS

CROSS-REFERENCE TO RELATED APPLICATIONS

This application claims priority to and is a continuation of International Patent Application No. PCT/US2020/032511, filed May 12, 2020, which claims the benefit of U.S. Provisional Patent Application No. 62/847,208, filed May 13, 2019. Each of the PCT/US2020/032511 and U.S. 62/847,208 applications are incorporated by reference herein in their entireties.

BACKGROUND

Light imaging, detection and ranging (LIDAR) systems measure distance to a target by illuminating the target with a pulsed laser light and measuring the reflected pulses with a sensor. Time-of-flight measurements can then be used to make a digital 3D-representation of the target. LIDAR systems can be used for a variety of applications where 3D depth images are useful including archaeology, geography, geology, forestry, mapping, construction, medical imaging and military applications, among others. Autonomous vehicles can also use LIDAR for obstacle detection and avoidance as well as vehicle navigation.

Some LIDAR systems include a mechanical, moving component that physically scans a transmitting and receiving element around a rotational angle of less than or equal to 360° to capture an image of a scene in a field. One example of such a system that can be used for obstacle detection and avoidance in vehicles is often referred to as a rotating or spinning LIDAR system. In a rotating LIDAR system, a LIDAR sensor is mounted, typically within a housing, to a column that rotates or spins a full 360 degrees. The LIDAR sensor includes coherent light emitters (e.g., pulsed lasers in the infrared or near-infrared spectrums) to illuminate a scene around the vehicle as the LIDAR sensor is continuously rotated through the scene. As the coherent light emitters spin around, they send pulses of radiation away from the LIDAR system in different directions in the scene. Part of the radiation, incident on surrounding objects in the scene, is reflected from these objects around the vehicle, and then these reflections are detected by the imaging system portion of the LIDAR sensor at different time intervals. The imaging system turns the detected light into electric signal.

In this way, information about objects surrounding the LIDAR system including their distances and shapes is gathered and processed. A digital signal processing unit of the LIDAR system can process the electric signals and reproduce information about objects in a depth image or a 3D point cloud that can be used as an aid in obstacle detection and avoidance as well as for vehicle navigation and other purposes. Additionally, image processing and image stitching modules can take the information and assemble a display of the objects around the vehicle.

Solid-state LIDAR systems also exist that do not include any moving mechanical parts. Instead of rotating through a scene, some solid state LIDAR systems flash an entire portion of a scene they intend to capture with light and sense the reflected light. In such systems, the transmitter includes an array of emitters that all emit light at once to illuminate the scene, and are thus sometimes referred to as "flash" LIDAR systems. Flash LIDAR systems are less complicated to make because of the lack of moving parts; however, they can require a large amount of power to operate since all of the emitters are activated at once and they can require a large amount of processing power to process signals from all the pixel detectors at once. Furthermore, existing LIDAR systems are designed to only capture emitted light for ranging purposes to build a three-dimensional image of the scene. Such images are monochromatic and do not reflect what is perceived by the naked eye in the visible light spectrum.

SUMMARY

Some embodiments of the disclosure pertain to stationary, solid-state LIDAR systems in which there is no spinning column that can capture two-dimensional images in addition to distance measurements for generating three-dimensional images of a scene. Embodiments can capture the image of a scene at a high resolution and low power consumption and with improved accuracy, reliability, size, integration and appearance as compared to currently available spinning LIDAR systems.

According to some embodiments, a solid state electronic scanning LIDAR system can include a light transmission module and a light sensing module whose operations are synchronized so that the firing sequence of an emitter array in the light transmission module corresponds to a capturing sequence of a time-of-flight (TOF) sensor array in the light sensing module for time-of-flight measurements. The LIDAR system can further include an image capturing module that includes an image sensor array that can capture ambient light images from the same field of view as the emitter array and the TOF sensor array. In various embodiments, the image sensor array can be operated as a rolling shutter camera or as a global shutter camera, and in some embodiments the image sensor array can be operated in a manner that is synchronized with the TOF sensor array or in a manner that is asynchronous with the TOF sensor array.

In some embodiments the emitter array, TOF sensor array, and image sensor array can each be coupled with image space telecentric bulk optics that collimate the emitter, TOF sensor, and image sensor fields of view, respectively, in object space. The emitter array can be an array of vertical-cavity surface-emitting lasers (VCSELs), and the TOF sensor array can include an array of TOF photosensors, where each TOF photosensor in the TOF sensor array includes a collection of photodetectors, such as single photon avalanche diodes (SPADs) for detecting light within a narrow spectrum, e.g., within the infrared spectrum. Unlike the TOF sensor array however, the image sensor array can include an array of image photosensors for capturing images of the scene as perceived within the visible light spectrum.

During operation, the emitter array can sequentially fire one or more columns of light emitters from the emitter array to project light (e.g., pulsed light beams in the near-infrared wavelength range) into a scene and the reflected light can be received by one or more corresponding columns of TOF photosensors in the TOF sensor array. By synchronizing the firing and capturing sequences, the solid-state scanning LIDAR system can efficiently capture images by only illuminating, at a given point in time, a certain amount of light from a set of emitters that can be efficiently detected by a corresponding set of TOF photosensors, thereby minimizing excessive illumination of a scene and concentrating energy in a manner that makes the best possible use of the available power to the system.

In further synchronization with the firing and capturing sequences, corresponding groups of image photosensors can be activated to measure ambient light in the scene. The field of view of the image sensor array can overlap with the field of view of the emitter array (which can be the same as the field of view of the TOF sensor array) so that the electronic scanning LIDAR system can capture a two-dimensional color image of objects in the scene while also capturing the distance to those objects in the scene. This enables the electronic scanning LIDAR system to provide a high-resolution color image of the scene in addition to the distances to objects in the scene so that the user can better understand which part of the scene is being scanned by the electronic scanning LIDAR system.

In some embodiments, electronic scanning LIDAR systems herein can also utilize micro-optics to further improve the efficiency at which the time-of-flight measurements of a scene are captured. The micro-optics can improve the brightness and intensity of light emitted from the emitter array as well as minimize cross-talk between sensor pixels of the TOF sensor array in the electrically scanning LIDAR system. For example, in some embodiments an aperture layer can be positioned in front of the TOF photosensors in the TOF sensor array. Each light emitter can correspond with an aperture in the aperture layer, and each aperture can correspond to a TOF photosensor in the TOF sensor array element such that each light emitter corresponds with a specific TOF photosensor. The aperture can mitigate the exposure of stray light on neighboring TOF photosensors as well as narrow the field of view for a TOF photosensor to a single point in the field.

In some embodiments an electronically scanning optical system includes an emitter array having a plurality of light emitters configured to emit light into a field external to the optical system, a time of flight (TOF) sensor array including a plurality of TOF photosensors configured to detect emitted light reflected back from the field, and an image sensor array comprising a plurality of image photosensors configured to detect ambient light in the field, where a field of view of the emitter array corresponds to a field of view of the TOF sensor array and at least a subset of a field of view of the image sensor array. The optical system further includes an emitter controller coupled to the emitter array and configured to activate the plurality of light emitters in each emission cycle by activating a subset of the plurality of light emitters at a time, a TOF sensor controller coupled to the TOF sensor array and configured to synchronize the readout of individual TOF photosensor within the TOF sensor array concurrently with the firing of corresponding light emitters in the emitter array such that each light emitter in the emitter array can be activated and each TOF photosensor in the TOF sensor array can be readout through the emission cycle, and an image sensor controller coupled to the array of image photosensors and configured to readout at least a portion of the array of image photosensors whose field of view overlaps with a field of view of the entire emitter array to capture an image image that is presentative of the field during the emission cycle.

In some embodiments a solid state optical system is disclosed that includes: a time of flight (TOF) sensor array, an image sensor array, an emitter array, an emitter controller, a TOF sensor controller and an image sensor controller. The TOF sensor array can include a plurality of TOF photosensors operable to detect light emitted from the emitter array and reflected back from a field external to the solid state optical system, wherein each TOF photosensor in the plurality of TOF photosensors has a discrete field of view in the field that is non-overlapping beyond a threshold distance from the optical system with the fields of view of the other TOF photosensors in the plurality of TOF photosensors. The image sensor array can include a plurality of image photosensors configured to detect ambient light in the field, wherein the discrete fields of view of each TOF photosensor in the plurality of TOF photosensors defines a field of view of the TOF sensor array and wherein and wherein a field of view of the image sensor array encompasses the field of view of the TOF sensor array. The emitter array can include a plurality of light emitters each of which is configured to emit a discrete beam of light at an operating wavelength into a field external to the optical system such that the emitter array outputs a plurality of discrete beams of light according to an illumination pattern that substantially matches, in size and geometry across a range of distances from the system, the field of view of the TOF sensor array. The emitter controller can be coupled to the emitter array and operable to activate the plurality of light emitters in each emission cycle by activating a subset of the plurality of light emitters at a time. The TOF sensor controller can be coupled to the TOF sensor array and operable to synchronize a readout of individual TOF photosensors within the TOF sensor array concurrently with a firing of corresponding light emitters in the emitter array such that each light emitter in the emitter array can be activated and each TOF photosensor in the TOF sensor array can be readout through the emission cycle. And, the image sensor controller can be coupled to the array of image photosensors and operable to readout at least a portion of the array of image photosensors whose field of view overlaps with a field of view of the emitter array to capture an image that is presentative of the field during the emission cycle.

In still other embodiments a solid state optical system is provided that includes a light detection system, an image capturing system and a light emission system. The light detection system can include a first bulk optic having a focal length, an aperture layer including a plurality of apertures spaced apart from the first bulk optic by the focal length, a time of flight (TOF) sensor array comprising a plurality of TOF photosensors, a lens layer including a plurality of lenses disposed behind the aperture layer the TOF sensor array, and an optical filter operable to pass a narrow band of light centered at a first wavelength and disposed between the first bulk optic and the TOF sensor array. The aperture layer, lens layer and TOF sensor array can be arranged to form a plurality of TOF channels with each TOF channel in the plurality of TOF channels including an aperture from the plurality of apertures, a lens from the plurality of lenses and a TOF photosensor from the plurality of TOF photosensors. Each TOF photosensor in the plurality of TOF channels can include a plurality of single photon avalanche diodes (SPADs) and each TOF channel in the plurality of TOF channels can define a discrete field of view in a field ahead of the optical system that is non-overlapping beyond a threshold distance from the optical system and wherein each TOF channel communicates light incident on the first bulk optic to the plurality of SPADs of the TOF channel. The image capturing system can include a second bulk optic and an image sensor array including a plurality of image photosensors operable to detect ambient light in the field received through the second bulk optic. The discrete fields of view of each TOF photosensor in the plurality of TOF photosensors can define a field of view of the TOF sensor array and a field of view of the image sensor array can encompass the field of view of the TOF sensor array. The light emission system can include a third bulk optic and an emitter array including a plurality of vertical-cavity surface-emitting lasers (VCSELs) each of which is configured to emit a discrete beam of light at the first wavelength through the third bulk optic into a field external to the optical system such that the emitter array outputs a plurality of discrete beams of light according to an illumination pattern that substantially matches, in size and geometry across a range of distances from the system, the field of view of the TOF sensor array.

The solid state optical system can further include an emitter controller, a TOF sensor controller and an image sensor controller. The emitter controller can be coupled to the emitter array and operable to activate the plurality of VCSELs in each emission cycle by activating a subset of the plurality of light emitters at a time. The TOF sensor controller can be coupled to the TOF sensor array and operable to synchronize a readout of individual TOF photosensors within the TOF sensor array concurrently with a firing of corresponding light emitters in the emitter array such that each light emitter in the emitter array can be activated and each TOF photosensor in the TOF sensor array can be readout through the emission cycle. The image sensor controller can be coupled to the array of image photosensors and operable to readout at least a portion of the array of image photosensors whose field of view overlaps with a field of view of the emitter array to capture an image that is presentative of the field during the emission cycle.

A better understanding of the nature and advantages of embodiments of the present disclosure may be gained with reference to the following detailed description and the accompanying drawings. It is to be understood, however, that each of the figures is provided for the purpose of illustration only and is not intended as a definition of the limits of the scope of the disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIGS. 7A-7C are a timing diagrams illustrating the synchronization of an image sensor array with an emitter array where the activation rate of the image sensor array is a multitude higher than the activation rate of the emitter array according to some embodiments of the present disclosure.

DETAILED DESCRIPTION

Figure 1:
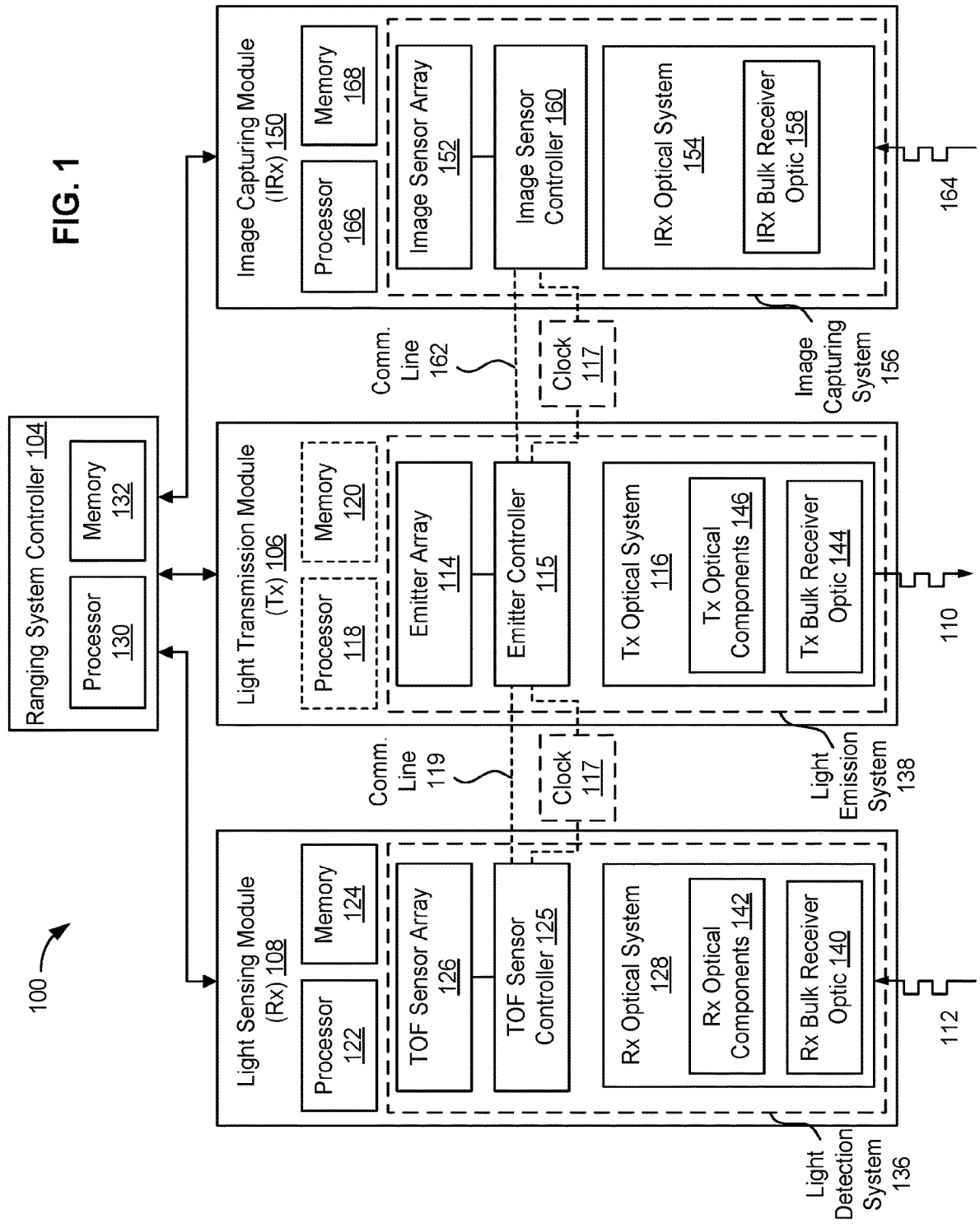
FIG. 1 is a block diagram of an exemplary solid state electronic scanning LIDAR system, according to some embodiments of the present disclosure.

Some embodiments of the disclosure pertain to stationary, solid-state LIDAR systems in which there is no spinning column. Embodiments can not only emit narrowband light into a field external to the LIDAR system and capture the emitted narrowband light after it has reflected off an object in the field for time-of-flight measurements, but also sense ambient, visible light at the field. Embodiments can then use the captured emitted light to create a three-dimensional representation of the field, and use the captured ambient, visible light to create a high-resolution two-dimensional image of the field. The three-dimensional representation of the field can then be matched with the two-dimensional image of the scene, thereby improving the situational awareness of the solid-state LIDAR system.

A solid-state array electronic scanning LIDAR system according to some embodiments of the disclosure can include a light transmission module and a light sensing module. The light transmission module can include a transmitter layer that includes an array of individual emitters, and the light sensing module can include a TOF sensor layer that includes an array of TOF photosensors. Each emitter in the emitter array can be paired with a corresponding sensor (i.e., TOF photosensor) in the TOF sensor array. In some embodiments, instead of flashing a scene with the entire set of emitters, only a subset of emitters are activated at a time and only a corresponding subset of the TOF photosensors are read out simultaneous with the firing of the emitters. Different subsets of emitters are then activated at different times with corresponding subsets of the TOF photosensors being read out simultaneously so that all emitters in the emitter array can be activated and all the TOF photosensors in the TOF sensor array can be readout through one emission cycle.

The electronic scanning LIDAR system can also include an image capturing module so that the system can capture high-resolution images of the scene as perceived within the visible light spectrum from the ambient light of the scene. The field of view of an image sensor array in the image capturing module can overlap with the field of view of the emitter array (i.e., the field of view of the emitter array can be a subset of the field of view of the image sensor array where the subset is not limited to just a portion of the whole field of view but can be equal to the whole field of view) so that the electronic scanning LIDAR system can capture a color image of objects in the scene while also capturing the distance to those objects in the scene. In some embodiments, the image sensor array is formed of an array of image photosensors, each sensitive to visible light.

In some embodiments the image capturing module can be operated as a rolling shutter camera such that subgroups of the array of image photosensors can be activated at the same time as a corresponding banks of emitters and in the same sequential order so that the image sensor array can sense ambient light of the scene that is also being illuminated by the emitter array for measuring distance. In some embodiments the image capture module can be operated as a global shutter camera such that the entire array of image photosensors as a whole can be activated at a time to sense ambient light within its field of view each time a bank of emitters is activated, in which case only the portion of the image sensor array that shares a field of view with the activated bank of emitters is read out and used to generate the image, as will be discussed in detail further herein.

I. Electronic Scanning LIDAR Systems

A better understanding of a solid state electronic scanning LIDAR system according to some embodiments of the disclosure can be ascertained with reference to FIG. 1, which illustrates a block diagram of an exemplary solid state electronic scanning LIDAR system 100, according to some embodiments of the present disclosure. The solid state electronic scanning LIDAR system 100 can include a ranging system controller 104, a light transmission (Tx) module 106, a light sensing (Rx) module 108, and an image capturing (IRx) module 150.

Tx module 106 and Rx module 108 can operate together to generate ranging data representative of distances to objects in a field of view, while IRx module 150 can be synchronized with the operation of Tx module 106 to simultaneously generate image data representative of an image of the objects in the same field of view. Solid state electronic scanning LIDAR system 100 can generate ranging data by transmitting one or more light pulses 110 from the light transmission module 106 to objects in a field of view surrounding system 100. Reflected portions 112 of the transmitted light are then detected by light sensing module 108 after some delay time. Based on the delay time, the distance to the reflecting surface can be determined. In addition to the ranging data, solid state electronic scanning LIDAR system 100 can also generate image data by sensing ambient, visible light from the same field of view in which light pulses 110 are emitted and from which reflected portions 112 of the transmitted light are reflected. The image data can be used to render a high-resolution image of the objects in the field of view so that the ranging data can be matched with corresponding image data to provide a more detailed image of the scene.

Light transmission module 106 includes an emitter array 114 (e.g., a two-dimensional array of emitters) and a Tx optical system 116, which when taken together with emitter array 114 can form a light emission system 138. Tx optical system 116 can include a bulk transmitter optic 144 that is image-space telecentric. In some embodiments, Tx optical system 116 can further include one or more Tx optical components 146, such as an aperture layer, a collimating lens layer and an optical filter, that can be combined with emitter array 114 to form an array of micro-optic transmitter channels where each micro-optic transmitter channel can increase the brightness of beams emanating from the bulk transmitter optic and/or for beam shaping, beam steering or the like, as discussed herein with respect to FIG. 11. Emitter array 114 or the individual emitters can be narrowband laser sources, such as vertical-cavity surface-emitting lasers (VCSEL), laser diodes, and the like. Tx module 106 can further include an optional processor 118 and memory 120, although in some embodiments these computing resources can be incorporated into ranging system controller 104. In some embodiments, a pulse coding technique can be used, e.g., Barker codes and the like. In such cases, memory 120 can store pulse-codes that indicate when light should be transmitted. In some embodiments, the pulse-codes are stored as a sequence of integers stored in memory.

Light sensing module 108 can include a TOF sensor array 126 (e.g., a two-dimensional array of TOF photosensors) in which each TOF photosensor of TOF sensor array 126 can correspond to a particular emitter of emitter array 114, e.g., as a result of a geometrical configuration of Rx module 108 and Tx module 106. In some embodiments each TOF photosensor (sometimes referred to herein as just a "sensor" or as a "pixel") can include a collection of photodetectors, e.g., SPADs or the like, while in other embodiments a TOF photosensor can be a single photon detector (e.g., an APD). Light sensing module 108 includes a receiver optical sensing system 128, which when taken together with TOF sensor array 126 can form a light detection system 136. In some embodiments, receiver optical sensing system 128 can include a receiver bulk receiver optic 140 and receiver optical components 142, such as an aperture layer, a lens layer and an optical filter, that can be combined with TOF sensor array 126 to form an array of micro-optic receiver channels where each micro-optic receiver channel measures light that corresponds to an image pixel in a distinct field of view of the surrounding field in which light ranging device 102 is positioned.

Further details of Rx and Tx optical systems according to some embodiments of the disclosure are discussed below in conjunction with FIG. 10 and in commonly-assigned U.S. patent application Ser. No. 15/979,235, entitled "Optical Imaging Transmitter with Brightness Enhancement", filed on May 14, 2018, and incorporated herein by reference in its entirety for all purposes.

According to some embodiments of the present disclosure, light ranging device 102 can include an IRx module 150 in addition to Rx module 108 and Tx module 106. IRx module 150 can include an image sensor array 152 (e.g., a two-dimensional array of image photosensors for detecting visible light) in which at least a portion of the field of view of the image sensor array 152 overlaps with the entire field of view of emitter array 114 as a result of a geometrical configuration of IRx module 150 and Tx module 106. Image sensor array 152 can be any suitable visible light sensor, such as a charged coupled device (CCD) sensor or a complementary metal-oxide-semiconductor (CMOS) image sensor. IRx module 150 can also include an image optical sensing system 154, which when taken together with image sensor array 152 can form an image capturing system 156. In some embodiments, image optical sensing system 154 can include an imaging bulk receiver optic 158 through which ambient light travels to focus and expose on image sensor array 152.

As mentioned herein, light ranging device 102 can be an electronic scanning LIDAR device that can capture an image based on distances to objects in a scene by activating only a bank of emitters at a time and by reading out only a corresponding bank of TOF photosensors simultaneous with the firing of the emitters. Different banks of emitters can be activated at different times with corresponding banks of TOF photosensors being readout simultaneously so that all emitters can be eventually activated and all the TOF photosensors in the TOF sensor array can be readout through one emission cycle. In addition to banks of TOF photosensors, corresponding groups of image photosensors can be simultaneously readout to capture an image of the scene by measuring ambient light. As an example, an emitter array can emit light by activating one bank at a time and in sequential order from left to right for each emission cycle while both the TOF sensor array and the image sensor array can be configured to readout the corresponding bank of TOF photosensors and corresponding group of image photosensors in a corresponding sequence, respectively. Accordingly, embodiments of the disclosure can include one or more components to synchronize the emitting and sensing of light.

For example, light transmission module 106 can include an emitter controller 115 coupled to emitter array 114. Emitter controller 115 is configured to control the operation of emitter array 126 by, for example, selectively firing each bank of emitters according to a desired firing sequence. Emitter controller 115 can include a suitable processor, such as an ASIC, microcontroller, FPGA or other suitable processing element along with one or more driving components for operating emitter array 114. Similarly, light detection system 136 can include a TOF sensor controller 125 coupled to TOF sensor array 126 and configured to control the operation of TOF sensor array 126. And, image capturing system 156 can include an image sensor controller 160 coupled to image sensor array 152 and configured to control the operation of image sensor array 152. TOF sensor controller 125 and image sensor controller 160 can each be any suitable component or group of components capable of selecting one or more photosensors to sense light, such as an ASIC, microcontroller, FPGA, or other suitable processor coupled to a selecting circuit, e.g., a multiplexer.

In some embodiments, emitter controller 115, TOF sensor controller 125, and image sensor controller 160 are synchronized such that the sequence of light emissions in emitter array 114 are synchronized with the sequence of activating and/or reading out the TOF photosensors in TOF sensor array 126 and image photosensors in image sensor array 152. As an example, emitter controller 115, TOF sensor controller 125, and image sensor controller 160 can all be coupled to a clock 117 so that all of the controllers can operate based on the same timing scheme. Clock 117 can be an electrical component that generates a specific signal that oscillates between a high and low state at a certain speed for coordinating actions of digital circuits. Optionally, emitter controller 115, TOF sensor controller 125, and image sensor controller 160 can include their own clock circuits for coordinating their own actions. In such embodiments, emitter controller 115, TOF sensor controller 125, and image sensor controller 160 can be communicatively coupled together via communication lines 119 and 162 such that TOF sensor controller 125 and image sensor controller 160 can synchronize their clocks with emitter controller 115. That way, TOF sensor controller 125, image sensor controller 160, and emitter controller 115 can operate TOF sensor array 126, image sensor array 152, and emitter array 114, respectively, in synchronization to effectuate image capture.

In some embodiments, image sensor controller 160 can operate image sensor array 152 as a rolling shutter camera where an image of the scene is captured by activating and reading out portions of the entire array of image photosensors in a sequential order. The sequence in which the portions of image sensor array 152 are activated and read out can correspond to the sequence in which the emitters in the emitter array are fired and/or the TOF photosensors in the TOF sensor array are read.

In certain embodiments, image sensor controller 160 can operate image sensor array 152 as a global shutter camera where an image of the scene is captured by activating the entire array of image photosensors at once and at a certain activation rate, but only reading out a portion of the image photosensors according to the sequential order. The rate at which image sensor array 152 activates, in some instances, correspond to the rate at which banks of emitters in the emitter array are fired. Instead of reading out image data from the entire image sensor array 152, only those portions of image photosensors with fields of view that correspond to the fields of view of the corresponding bank of emitters being fired may be read to generate image data for generating a color image of the scene.

As mentioned herein, the activation rate of image sensor array 152 can be synchronized with the operation of TOF sensor array 126. In such instances, the rate at which image sensor array 152 is activated can be equal to or greater than the rate at which TOF sensor array 126 is read (as well as the rate at which emitter array 114 is fired). For example, when the rates are the same, each time an image photosensor is activated, a TOF photosensor can be activated at the same time but for same or different durations, as will be discussed further herein with respect to FIG. 6. When the activation rate of image sensor array 152 is greater than the activation rate of TOF sensor array 126, e.g., 2×, 4×, or 8× the rate of TOF sensor array 126, image sensor array 152 can be activated several more times than TOF sensor array 126 within a given time period, as will be discussed further herein with respect to FIGS. 7A-7C.

In some additional embodiments, image sensor controller 160 can operate image sensory array 152 in an asynchronous manner with respect to the operation of emitter array 114 and TOF sensor array 126. For example, the activation rate of image sensor array 152 can be different from the activation rate of TOF sensor array 126 and emitter array 114, and not every activation of a TOF photosensor or firing of an emitter may correspond with a concurrently activating image photosensor. In such embodiments, a two-dimensional color image representation of the captured three-dimensional image can be generated by reading out image data captured from activations of groups of TOF sensor photosensors that are closest in time to the activation of TOF sensor array 126 or emitter array 114.

In some further embodiments, ranging system controller 104 can be configured to synchronize the operation of light sensing module 108, image capturing module 150, and light transmission module 106 such that the sequence of light emissions by emitter array 114 are synchronized with the sequence of sensing light by TOF sensor array 126 and image sensor array 152. For instance, ranging system controller 104 can instruct emitter array 114 of light transmission module 106 to emit light by activating one bank at a time and in sequential order from left to right for each emission cycle, and correspondingly instruct TOF sensor array 126 in light sensing module 108 and image sensor array 152 in image capturing module 150 to sense light one corresponding bank of TOF photosensors and group of image photosensors, respectively, at a time and in the same sequential order. In such embodiments, ranging system controller 104 can have its own clock signal on which it bases its sequencing instructions to light sensing module 108, image capturing module 150, light transmission module 106. It is to be appreciated that other forms of sequencing for light detection are envisioned herein and that such sequences are not limiting, as will be discussed further herein.

Figure 2A:
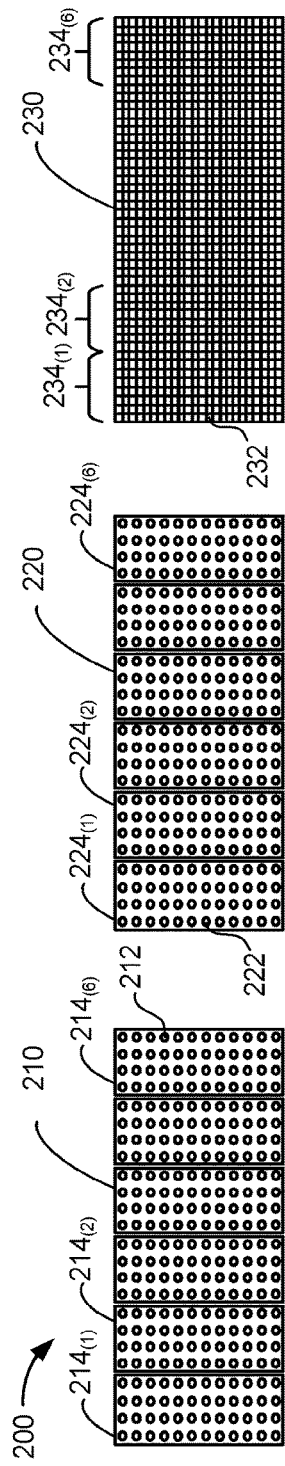
FIG. 2A is a simplified illustration of an emitter array, a TOF sensor array and an image sensor array for an exemplary solid state electronic scanning LIDAR system according to some embodiments of the present disclosure.

To illustrate one example of sequential firing of an emitter array and sensing of the TOF sensor array and image sensor array, reference is made to FIG. 2A, which is a simplified illustration of an emitter array 210 and TOF sensor array 220 for an exemplary solid state electronic scanning LIDAR system 200 according to some embodiments of the present disclosure. Emitter array 210 can be a two-dimensional m×n array of emitters 212 having m number of columns and n number of rows and TOF sensor array 220 can correspond with emitter array 210 such that each TOF photosensor 222 is mapped to a respective emitter 212 in emitter array 210. Thus, TOF sensor array 220 can be a corresponding two-dimensional m×n array of TOF photosensors 222. On the other hand, image sensing array 230 can be a two-dimensional y×z array of image photosensors 232 having y number of columns and z number of rows. In some embodiments, the number of columns and rows of the two-dimensional y×z array of image photosensors 232 can be greater than or substantially greater than the m×n array of emitters 212 so that the resolution of the image sensing array is substantially greater than the resolution of the emitter array. For example, in some embodiments image sensor array 230 can include 2×, 4×, 8×, 16× or more columns and/or rows of image photosensors than the number of columns and/or rows of TOF photosensors included in the TOF sensor array 126.

In some embodiments, emitter array 210 and TOF sensor array 220 are generally large arrays that include more elements (i.e., more emitters and more TOF photosensors) than emitter or TOF sensor arrays typically employed in rotating LIDAR systems. The size, i.e., overall physical dimensions, of TOF sensor array 220 (and thus the corresponding emitter array 210 for illuminating the field of view corresponding to TOF sensor array 220 as well) along with the pitch of the TOF photosensors within TOF sensor array 220 can dictate the field of view and the resolution of images capable of being captured by TOF sensor array 220. Larger sized arrays generally result in larger fields of view, and smaller pitch sizes generally result in captured images with higher resolution. In some embodiments, the overall dimensions of image sensor array 230 can be equal to or greater than the overall dimensions of emitter array 210, while its pitch can be less than or substantially less than the pitch of emitter array 210. Thus, image sensor array 230 can have the same or larger fields of view as emitter array 210 while achieving a larger resolution. In some embodiments, the overall dimensions of image sensor array 230 are greater than the overall size of emitter array 210 so that alignment tolerances can be increased and compatibility with differently sized emitter arrays can be achieved, as will be discussed further herein with respect to FIGS. 5A-5B.

In some embodiments, emitter array 210, TOF sensor array 220, and image sensor array 230 are each formed from a single semiconductor die while in other embodiments, one or more of arrays 210, 220, and 230 can be formed of multiple chips mounted to a common substrate. In some embodiments, each of emitter array 210, TOF sensor array 220, and image sensor array 230 are formed on independent semiconductor die that are configured to have overlapping fields of view, as will be discussed further herein with respect to FIG. 4.

Emitter array 210 can be configured to be operated such that one or more sets of emitters (wherein each set is referred to herein as a "bank") can be fired simultaneously. For example, in the embodiments depicted in FIG. 2A, emitter array 210 is configured to include six banks 214(1) . . . 214(6) where each bank includes four columns of emitters. TOF sensor array 220 can be configured with a similar geometry as emitter array 210 such that TOF photosensors 222 are arranged in similarly arranged banks. On the other hand, image sensor array 230 can be configured to have a higher resolution than emitter array 210 and have certain groups of image photosensors that are positioned within a field of view of corresponding emitter banks to be assigned to those banks. Thus, in the embodiment depicted in FIG. 2A, TOF sensor array 220 is also configured to include six banks 224(1) . . . 224(6) where each bank includes four columns of TOF photosensors; and, image sensor array 230 can be split into six groups 234(1)-234(6) where each group has the same field of view as a corresponding emitter bank 214(1)-214(6).

Figure 2B:
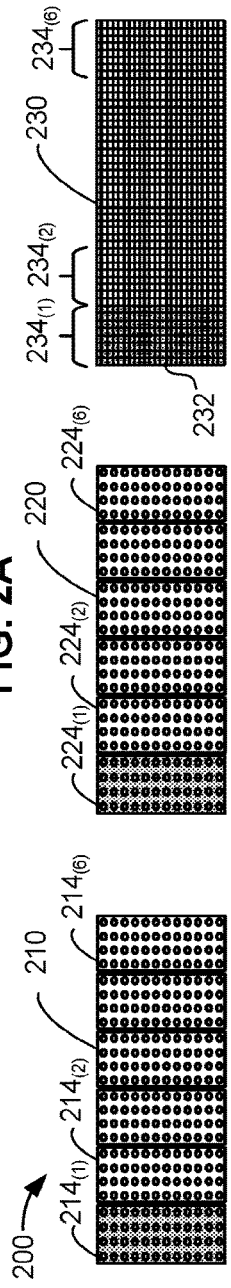
FIGS. 2B-2D are simplified diagrams illustrating an exemplary firing sequence of an emitter array and a sensor readout sequence of a TOF sensor array and an image sensor array, according to some embodiments of the present disclosure.
Figure 2C:
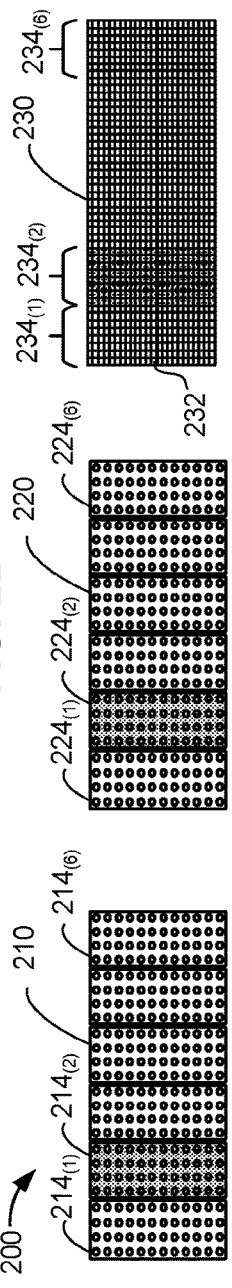
Figure 2D:
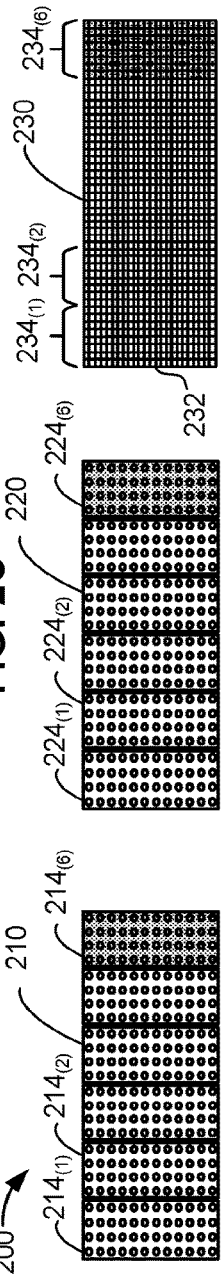

FIGS. 2B-2D are simplified diagrams illustrating a firing sequence of emitter array 210 and sensor readout sequence of TOF sensor array 220 and image sensor array 230 according to some embodiments of the present disclosure in which image sensor array 230 is operated with a rolling shutter technique. As shown in FIG. 2B, a first stage of an image capturing sequence can start by firing emitter bank 214(1) of emitter array 210 and simultaneously reading out sensor bank 224(1) of TOF sensor array 220 and image sensor bank 234(1) of image sensor array 220. During this first stage, a pulse of light emitted from each individual emitter in emitter bank 214(1) is emitted into a field. The emitted light can then be reflected off of one or more objects in the field and be captured by a respective subset of TOF photosensors within sensor bank 224(1) of TOF sensor array 220. Meanwhile, ambient light existing at the scene within the field of view is captured by the respective group 234(1) of image photosensors 232.

Next, during a second stage of the sequence, emitters from a second bank 214(2) of the emitter array can be activated to emit a pulse of light that can be read out by the TOF photosensors in TOF sensor bank 224(2) in the TOF sensor array while the image photosensors in group 234(2) in the image sensor array measures ambient light at that location, as shown in FIG. 2C. The sequential firing of banks of emitters and simultaneous reading out of TOF photosensors in corresponding banks and groups of image photosensors continues until the last bank of emitters 214(6) is activated concurrently with the last bank of TOF photosensors 224(6) and image photosensors 234(6) being read as shown in FIG. 2D. When one full cycle is complete (six stages of the image capturing sequence in the example depicted in FIGS. 2B-2D), every bank of emitters in emitter array 210 will have been activated and every corresponding bank of TOF photosensors in TOF sensor array 220 will have been readout to detect photons emitted from the corresponding banks of emitter array 210, and every corresponding group of image photosensors in image sensor array 230 will have been readout to detect ambient light in the field of view which light is emitted by emitter array 210. The cycle can then be continuously repeated while LIDAR system 200 is in operation.

Although FIG. 2A illustrates the emitter array and both sensor arrays as divided into six different banks/groups each having a specific number of emitters or photosensors, embodiments are not limited to such configurations. Other embodiments can have more or less than six banks/groups and more or less emitters or photosensors per bank/group. For example, in some embodiments k banks of emitters and k banks/groups of photosensors are employed where k is more than or fewer than the six banks/groups depicted in FIG. 2A emitter array. As further examples, in some embodiments LIDAR sensor 200 can be divided into 16, 32, 64, 128, or more banks where each bank includes 1, 2, 4, 8 or more emitter columns, without departing from the spirit and scope of the present disclosure. Additionally, while FIG. 2A discusses banks in terms of columns of emitters and columns of photosensors, in other embodiments the emitter and photosensor arrays can be divided into banks having one or more rows of emitters and one or more rows of photosensors instead of columns such that one or more row of emitters are fired while simultaneously reading one or more corresponding rows of photosensors. In still other embodiments, a bank in emitter array 210 can include a subset of emitters that includes emitters in multiple columns and multiple rows (for example, emitters arranged in a square or rectangular pattern) and a bank/group in TOF sensor array 220/image sensor array 230 can include a subset of TOF photosensors/image photosensors arranged in a pattern corresponding to the subset of emitters.

Additionally, while FIGS. 2B-2D illustrate an image capturing sequence in which fired emitters are advanced one bank/group per stage, embodiments of the disclosure are not limited to any particular sequence. For example, in some embodiments the following sequence can be employed in LIDAR system having k banks/groups: for stage one, a first bank of emitter array 210 is fired; for stage 2, bank (k/2+1) is fired; for stage 3, bank 2 is fired, for stage 4, bank (k/2+2) is fired, etc. until the $k^{th}$ stage when bank k is fired. Such an embodiment can be beneficial in minimizing cross-talk within the TOF sensor array as adjacent sensor banks are not readout in successive stages. As another example, two or more adjacent banks of emitters can be fired concurrently while the corresponding two or more adjacent banks/groups of sensors are read out. As an illustration where two banks are fired and read simultaneously, during a first stage of an image capturing sequence, banks 214(1) and 214(2) of emitter array 210 can be fired, during a second stage banks 214(3 and 214(4) can be fired, etc.

Although FIGS. 2B-2D illustrate embodiments where the image sensor array is operated according to a rolling shutter technique where certain subsets of image photosensors are activated and read in a certain order, embodiments are not limited to such operations. For instance, some embodiments are configured to operate the image sensor array with a global shutter technique where the entire array of image photosensors of the image sensor array is activated at each stage of the emitter firing sequence, but where only those image photosensors that have a field of view that correspond with the field of view of the fired emitter bank and/or the field of view of the activated TOF sensor bank is read out to generate image data for capturing a two-dimensional color image of the scene. These examples discussed with respect to FIGS. 2B-2D are just a few of the many different firing and readout sequences that are possible and other firing and readout sequences are possible in other embodiments.

Figure 3:
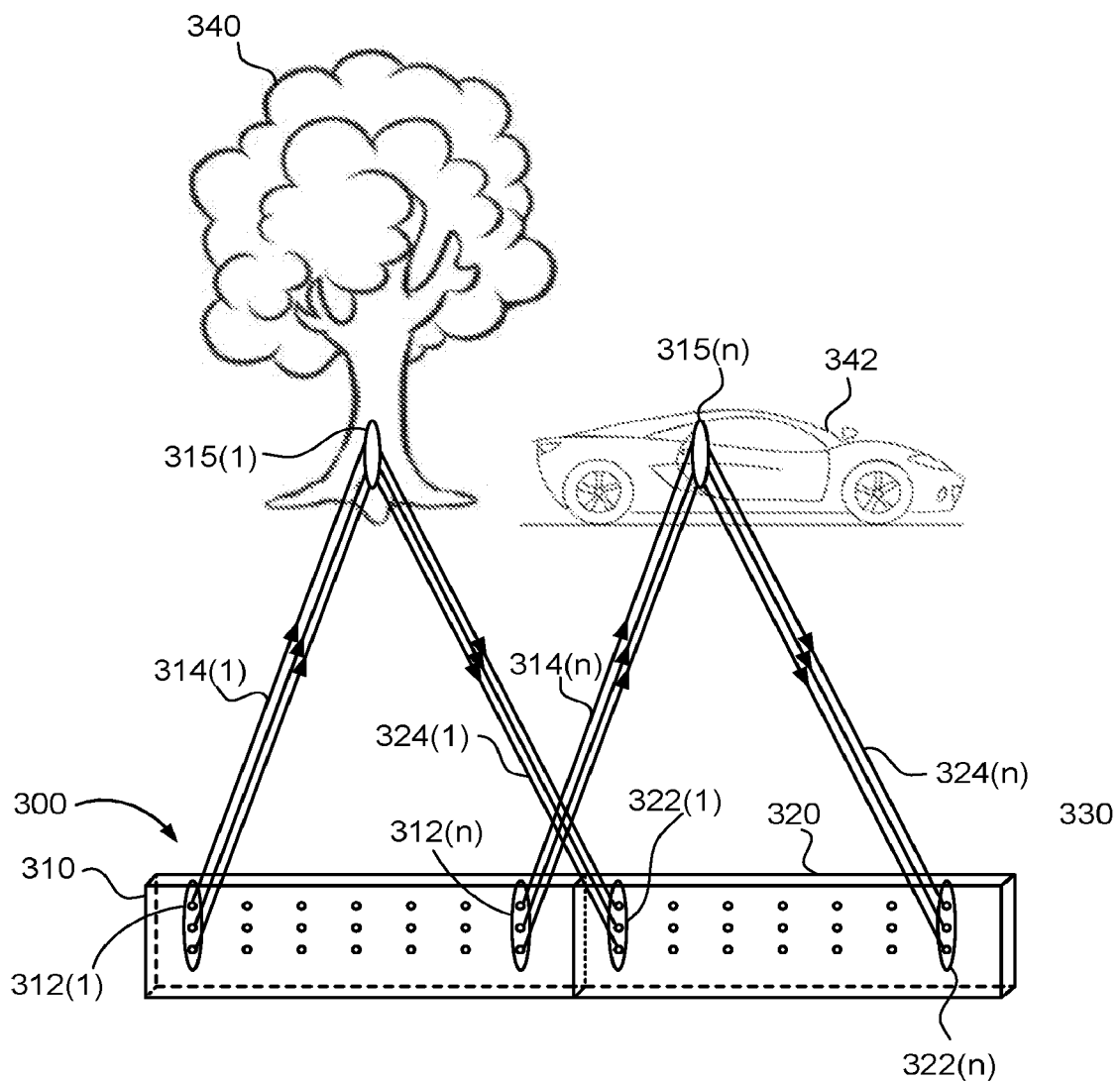
FIG. 3 is an illustrative example of the light transmission and detection operation for an electronic scanning LIDAR system in a scenario according to some embodiments of the present disclosure.
Figure 4:
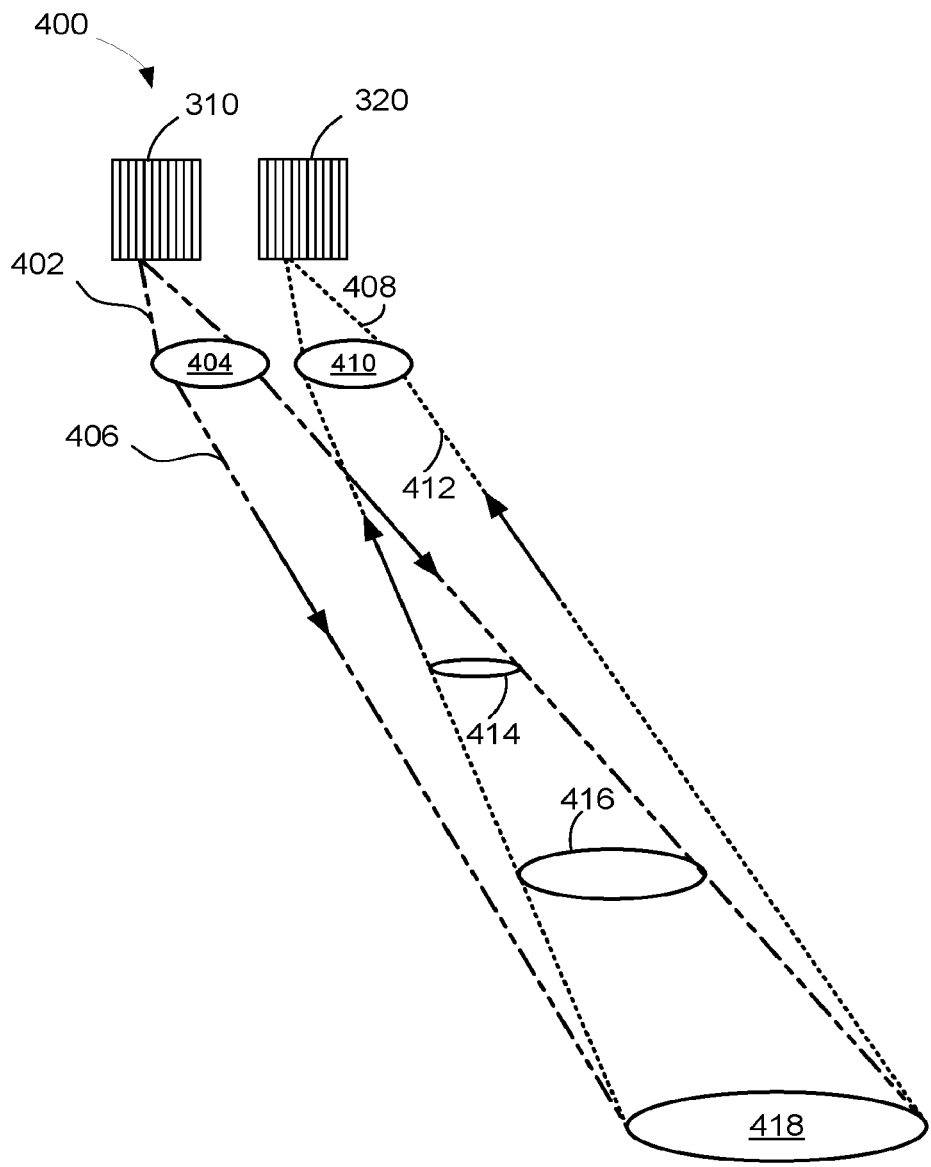
FIG. 4 is a simplified illustration of the overlapping field of views for an emitter array, a TOF sensor array, and an image sensor array according to some embodiments of the present disclosure

FIG. 3 is an illustrative example of the light transmission and TOF detection operation for an electronic scanning LIDAR system 300 according to some embodiments of the present disclosure in a particular scenario. Specifically, FIG. 3 shows solid state electronic scanning LIDAR system 300, which can be representative of LIDAR system 100 shown in FIG. 1, collecting three-dimensional distance data and image data of a volume or scene that surrounds the system. FIG. 3 is an idealized drawing to highlight relationships between emitters and sensors, and thus other components are not shown. FIG. 4 is referenced in the discussion of FIG. 3 to provide a better understanding of the range determination techniques using a TOF approach. An image sensor array is not shown in FIGS. 3 and 4 to simplify the discussion of how LIDAR systems in embodiments perform ranging, but it is to be understood that the image sensor array can be positioned proximate to the TOF sensor array and/or the emitter array to sense ambient light from the same or overlapping fields of view in the scene as the emitter and TOF sensor array as will be discussed herein with respect to FIGS. 5A and 5B.

With reference to FIG. 3, electronic scanning LIDAR system 300 includes an emitter array 310 (e.g., emitter array 114) and a TOF sensor array 320 (e.g., TOF sensor array 126). Emitter array 310 can be an array of light emitters, e.g. an array of vertical-cavity surface-emitting lasers (VCSELs) and the like, that includes banks of emitters 312(1) to 312(n). TOF sensor array 320 can be an array of photosensors that includes banks of TOF photosensors 322(1) to 322(n). The TOF photosensors can be pixelated light sensors that employ, for each TOF photosensor, a set of discrete photodetectors such as single photon avalanche diodes (SPADs) and the like. However, various embodiments can deploy other types of photon sensors.

For ease of illustration, emitter array 310 is depicted as having seven banks of emitters where each bank includes a single column of three emitters and TOF sensor array 320 is depicted as having a corresponding arrangement of TOF photosensors. It is to be appreciated that banks of emitters 312(1) to 312(n) and banks of TOF photosensors 322(1) to 322(n) can be representative of portions of much larger banks of emitter array 310 and TOF sensor array 320, respectively. Thus, while FIG. 3A only shows emitters and TOF photosensors for 21 distinct points for ease of illustration, it can be understood that other implementations can have significantly more emitters including banks that have multiple columns of emitters where each column includes many more than three individual emitters. That is, a denser sampling of points can be achieved by having a denser array of emitters and a corresponding denser array of TOF photosensors.

Each emitter can be spaced apart from its neighbor by a pitch distance and can be configured to transmit light pulses into a different field of view from its neighboring emitters, thereby illuminating a respective field of view associated with only that emitter. For example, bank of emitters 312(1) emits illuminating beams 314(1) (each formed from one or more light pulses) into region 315(1) of the field of view and thus reflect off of a tree 330 in the field. Likewise, bank of emitters 312(n) emits illuminating beams 314(n) into region 315(n) of the field of view. It is to be appreciated that in the embodiment shown in FIG. 3A, emitter array 310 scans through its banks in sequential order from left to right. Thus, FIG. 3A shows the first instance of time where bank of emitters 312(1) is being activated and the last instance of time where the last bank, i.e., bank of emitters 312(n), is activated. The other banks can sequentially step from left to right between bank 312(1) to 312(n). While FIG. 3A shows an embodiment where emitter and TOF sensor arrays 310 and 320 operate by vertically-oriented banks and in sequential order, embodiments are not limited to such configurations. In other embodiments, emitter and TOF sensor arrays 310 and 320 can operate by vertically-oriented banks in a non-sequential order to minimize cross-talk, or by horizontally-oriented banks in a sequential or non-sequential order, or any other suitable order for emitting and receiving light, as will be discussed above and in detail further herein.

Each field of view that is illuminated by an emitter can be thought of as a pixel or spot in the corresponding 3D image that is produced from the ranging data. Thus, each emitter can be distinct from other emitters and be non-overlapping with other emitters such that there is a one-to-one mapping between the set of emitters and the set of non-overlapping fields of view. In some embodiments, emitter array 310 and TOF sensor array 320 are each solid state devices that can be very small and very close to each other. For instance, the size of an emitter or TOF sensor array, according to the present embodiments, could range from a few millimeters to a few centimeters. As such, the dimensions of the two arrays and their separation distance, which can be less than a couple of centimeters, are negligible compared with the distances to the objects in the scene. When this arrangement of emitter and TOF sensor arrays is paired with respective bulk optics that can collimate the light emitted by the emitter array and focus the reflected light into the TOF sensor array, the TOF sensor array and emitter array can have significantly similar fields of view beyond a threshold distance such that each emitter and corresponding TOF sensor looks at essentially the same spot in the field. This concept can be better understood with reference to FIG. 4.

FIG. 4 is a simplified illustration of the overlapping field of views for emitter array 310 and TOF sensor array 320, according to some embodiments of the invention. Each emitter in emitter array 310 can emit a pulse of light that is shown in FIG. 4 as a cone 402 that gets collimated through a bulk transmitter optic 404 and outputted into the field as emitted light 406. Emitted light 406 can then reflect off of one or more objects in the field and propagate back toward TOF sensor array 320 as reflected light 412 that first propagates through bulk receiver optic 410, which focuses reflected light 412 back down into a focal point as a cone of pulsed light 408 and then onto a corresponding TOF photosensor within TOF sensor array 320. As can be understood with reference to FIG. 4, the distance between bulk transmitter and receiver optics 184 and 410, which can range, for example between 1-3 cm, is relatively small compared with the distance to the scene. Thus, as the scene gets farther, the field of view for the emitter array increasingly overlaps with the field of view for the TOF sensor array. For instance, as shown in FIG. 4, overlapping regions 414, 416, and 418 of the fields of view for emitter array 310 and TOF sensor array 320 get larger as the distance to the scene increases. Thus, at distances near the end of the scene, e.g., objects in the field, the field of view of emitter array 310 can substantially overlap the field of view of TOF sensor array 320. Accordingly, each corresponding emitter and TOF photosensor can observe essentially the same point in the scene even though the bulk receiver and transmitter optics are separated by one or more centimeters. That is, each illuminating beam projected from bulk transmitter optic 184 into the field ahead of the system can be substantially the same size and geometry as the field of view of a corresponding TOF photosensor (or a micro-optic receiver channel for the corresponding TOF photosensor) at a distance from the system. In some embodiments, emitter array 310 can selectively project illuminating beams into the field ahead of system 300 according to an illumination pattern that substantially matches, in size and geometry across a range of distances from system 300, the fields of view of the input channels. By having substantially overlapping field of views between the emitter array and TOF sensor array, solid state electronic scanning LIDAR system 300 can achieve a high signal-to-noise ratio (SNR).

In some embodiments, the transmitter array and TOF sensor array have matching geometries and the bulk optics of the emitter array are substantially identical to the bulk optics of the TOF sensor array. In other embodiments the dimensions and the bulk optics of TOF sensor array 320 may not be identical to those of emitter array 310, however, they can be chosen such that corresponding banks of emitter array 310 and TOF sensor array 320 have significantly the same field of view. For example, the size of TOF sensor array 320 could be larger than that of emitter array 310. This would imply that bulk receiver optics 410 of TOF sensor array 320 should be different than bulk transmitter optics 184 of emitter array 310, and the two bulk optics should be carefully chosen such that the field of view of corresponding banks in the two arrays are significantly the same. For instance, a similar bulk optics with lens elements that are twice as large as those of emitter array 310 could be used. The resulting bulk receiver optics would have a focal length twice as long as the focal length of the bulk transmitter optics. In this case, TOF sensor array 320 should be twice as tall and twice as wide as emitter array 310 with receiving aperture diameters twice that of the emitting diameters, ensuring that the angular field of view for every TOF photosensor and emitter match.

To ensure that the corresponding banks of emitter array 310 and TOF sensor array 320 see the same field of view, an alignment process of LIDAR system 300 can be performed before field use, e.g., by the manufacturer. Design features of some embodiments of the invention (e.g, having a single semiconductor die or multichip module for the emitter array and a single semiconductor die of multichip module for the TOF sensor array) allows this alignment to be performed only once by the manufacturer, thereby easing the way at which LIDAR system 300 is manufactured and maintained after manufacturing. During the alignment of the optics, one can measure the field of view of every pixel and every emitter to ensure they are significantly identical. The alignment process can account for lens properties such as aberration, distortion, and focal length as well as adjusting position and orientation of lens elements with respect to external components.

Because the fields of view of the emitters are overlapped with the fields of view of their respective sensors, each TOF photosensor ideally can detect the reflected illumination beam that originates from its corresponding emitter with ideally no cross-talk, i.e., no reflected light from other illuminating beams is detected. For example, with reference back to FIG. 3A, bank of emitters 312(1) emits illuminating beams 314(1) into region 315(1) of the field of view and some of the illuminating beams reflect from object 330, i.e., a tree. Ideally, a reflected portion of light 324(1) is detected by bank of TOF photosensors 322(1) only. Thus, bank of emitters 312(1) and bank of TOF photosensors 322(1) share the same field of view. Likewise, bank of emitters 312(n) and bank of TOF photosensors 322(n) can also share the same field of view such that reflected portion of light 324(n) is only detected by TOF photosensors 322(n). For instance, during the last iteration of the emitting cycle, bank of emitters 312(n) emits illuminating beams 314(n) into region 315(n) of the field of view and some of the illuminating beam reflects from object 332, i.e., a car parked next to object 330. In one cycle, solid state electronic scanning LIDAR system 350 in FIG. 3A can capture and generate an image representing the scene including portions of tree 330 and car 332. Additional cycles can further capture other regions of the scene, especially if system 300 is moving, such as when system 300 is mounted on a car, as will be discussed further herein with respect to FIGS. 12 and 13. While the corresponding emitters and TOF photosensors are shown in FIG. 3A as being in the same relative locations in their respective array, any emitter can be paired with any TOF photosensor depending on the design of the optics used in the system.

During a ranging measurement, the reflected light from the different fields of view distributed around the volume surrounding the LIDAR system is collected by the various TOF photosensors and processed, resulting in range information for any objects in each respective field of view. As described above, a time-of-flight technique can be used in which the light emitters emit precisely timed pulses, and the reflections of the pulses are detected by the respective TOF photosensors after some elapsed time. The elapsed time between emission and detection and the known speed of light is then used to compute the distance to the reflecting surface. In some embodiments, additional information can be obtained by the TOF photosensor to determine other properties of the reflecting surface in addition to the range. For example, the Doppler shift of a pulse can be measured by the sensor and used to compute the relative velocity between the TOF photosensor and the reflecting surface. The pulse strength can be used to estimate the target reflectivity, and the pulse shape can be used to determine if the target is a hard or diffuse material.

According to some embodiments, LIDAR system 300 can transmit multiple pulses of light. In some embodiments, each coded-pulse has an embedded positive-valued pulse-code formed by the light intensity. The system can determine the temporal position and/or amplitude of optical pulses in the presence of background light by creating an intensity histogram of detected, reflected light at different time bins. For each time bin, the system adds a weighted value to the intensity histogram that depends on the intensity of detected light. The weighted values can be positive or negative and have varying magnitudes.

By selecting different combinations of positive-valued pulse-codes and applying different weights, the system can detect positive-valued and negative-valued codes suitable for standard digital signal processing algorithms. This approach gives a high signal-to-noise ratio while maintaining a low uncertainty in the measured temporal position of the reflected light pulses.

II. Configuration and Operation of Image Sensor Arrays for Image Capture

As mentioned herein, the emitter array and image sensor array of an electronically scanning LIDAR system can have overlapping fields of view so that the image sensor array can capture an image of the scene corresponding with the field of view of the emitter array.

A. Overlapping Fields of View

Figure 5A:
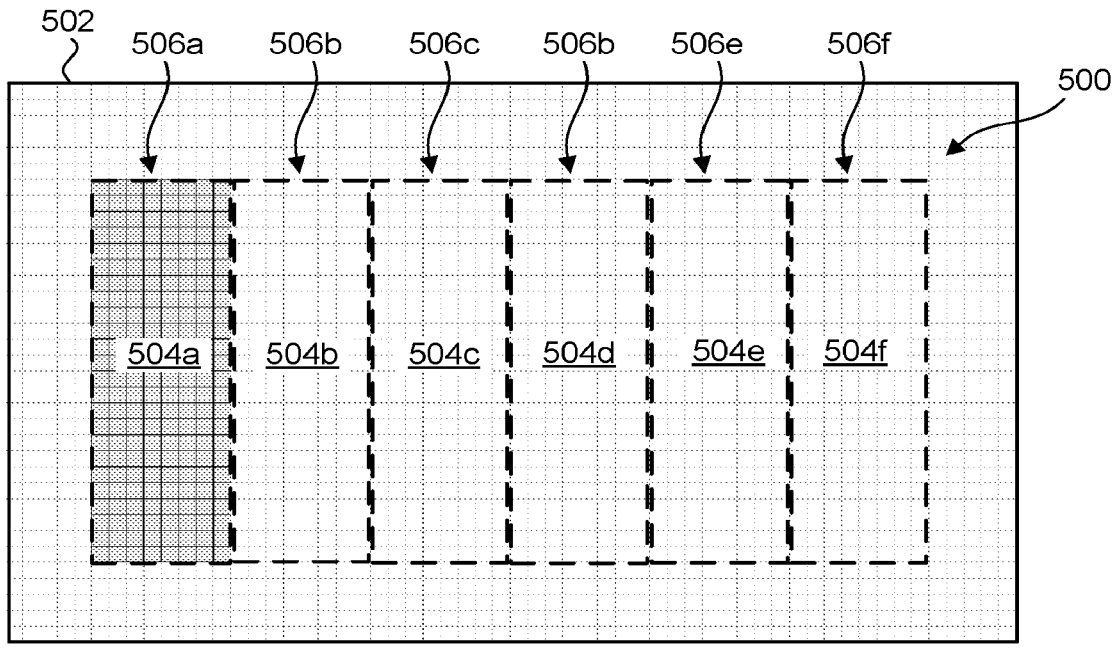
FIG. 5A is a simplified diagram illustrating overlapping field of views of an emitter array field of view and an image sensor array field of view according to some embodiments of the present disclosure.

FIG. 5A is a simplified diagram illustrating overlapping field of views of an emitter array field of view 500 and an image sensor array field of view 502, according to some embodiments of the present disclosure. The entire emitter array field of view 500 can overlap with at least a portion of image sensor array field of view 502 so that the image sensor can capture an image of the scene corresponding with the entire field of view of the emitter array. That is, in some embodiments, emitter array field of view 500 can be equal to or a subset of image sensor array field of view 502. Image sensor field of view 502 is shown with a plurality of rectangular blocks representing individual fields of view for individual image photosensors within the image sensor array.

Emitter array field of view 500 can include distinct field of view banks 504a-f corresponding in number to the number of banks of emitters in the emitter array—six in the example illustrated in FIG. 5A. Each field of view bank 504a-f can be an area of the field of view that is illuminated with light emitted from the corresponding bank of emitters, as discussed herein with respect to FIGS. 2A-2D and 3-4. Image sensor array field of view 502 can also include six fields of view groups 506a-f corresponding to the number of groups of image photosensors for sensing ambient light. Each field of view group 506a-f can be an area of the field of view that corresponds to an area in which the corresponding bank of emitters emit light, as discussed herein with respect to FIGS. 2A-2D and 3-4. Thus, during operation, as banks of emitters emit light in sequential order toward field of view banks 504a-f, groups of image photosensors having corresponding field of views 506a-f can concurrently readout image photosensor data in the same sequence to capture an image of the scene.

In some embodiments where the image sensor array is operated according to a rolling shutter technique, each image photosensor is individually addressable so that specific groups of image photosensors can be activated to sense light in a sequential order without having to activate every image photosensor in the image sensor array, e.g., without having to activate those image photosensors that do not have overlapping fields of view with a firing bank of emitters and/or an activated bank of TOF photosensors. In such instances, each image photosensor can be mapped to a corresponding emitter bank so that the image photosensor can be activated by a controller with a control signal. The mapping between image photosensors and emitter banks can be recorded in memory and used by the controller. For example, a control signal bus can be coupled to the image sensor array from an image sensor controller (e.g., image sensor controller 160). A control signal can be sent to the image sensor array indicating which group of image photosensors to activate, and thus in turn which field of view group 506a-f to measure. Continuing with the example shown in FIG. 5A, the control signal can be 1-6 where 1 indicates group 506a to be measured, and 6 indicates group 506f to be measured. Thus, group of image photosensors associated with field of view group 506a can be configured to activate when control signal 1 is received, as shown in FIG. 5A. The same can be said for the rest of groups 506b-f. Configuring the image sensor array to be individually addressable can save power as only a subset of image photosensors are activating to sense light, thereby minimizing power waste by illuminating all of the image photosensors at a time.

In embodiments where the image sensor array is operated according to a global shutter technique, the entire array of image photosensors can be activated each time. Thus, image data for the entire image sensor array field of view 502 can be captured even though only a portion of the field of view corresponds to the field of view of the firing bank of emitters, e.g., bank 504a. In such instances, the image data from only those image photosensors, e.g., group of image photosensors 506a, that correspond to the field of view of the firing bank of emitters 504a will be read, and all the image photosensors with fields of view outside the field of view of bank 504a are ignored. Thus, those image photosensors with fields of view outside of emitter array field of view 500 may be completely ignored.

To assign each image photosensor with the correct group control signal, a calibration process can be performed during manufacturing or at startup of the LIDAR system. Each emitter bank can be fired to emit light while keeping track of which image photosensors receive light. Those image photosensors that receive light when emitter bank 1 is fired can be programmed to activate when emitter bank 1 is fired. The same can be performed for the rest of the emitter banks.

Methods and configurations discussed herein with respect to the individually addressable configuration can also be implemented by image sensor arrays that are not individually addressable, e.g., image sensor arrays that are configured as global shutters. In such instances, the entire array of image photosensors are activated at once, rather than only a subset of them, each time the image sensor array is activated. Thus, some embodiments can configure the image sensor array to only readout the image data for those image photosensors that correspond to a specific field of view group 506a-f even though every image photosensor has been activated to sense light. Configuring the image sensor array as a global shutter can save design cost and ease of manufacture, and can allow the LIDAR system to leverage existing high quality image sensors for reasons discussed herein with respect to FIGS. 7A-7C.

In some embodiments, image sensor array field of view 502 can be larger than emitter array field of view 500 as shown in FIG. 5A. Thus the physical dimensions of the image sensor array may be larger than the physical dimensions of the emitter array. Having a larger image sensor array allows for greater compatibility with different emitter configurations of different sizes. Larger image sensor arrays also allow for more lenient manufacturing tolerances, thereby improving ease of manufacture and saving on manufacturing cost.

Figure 5B:
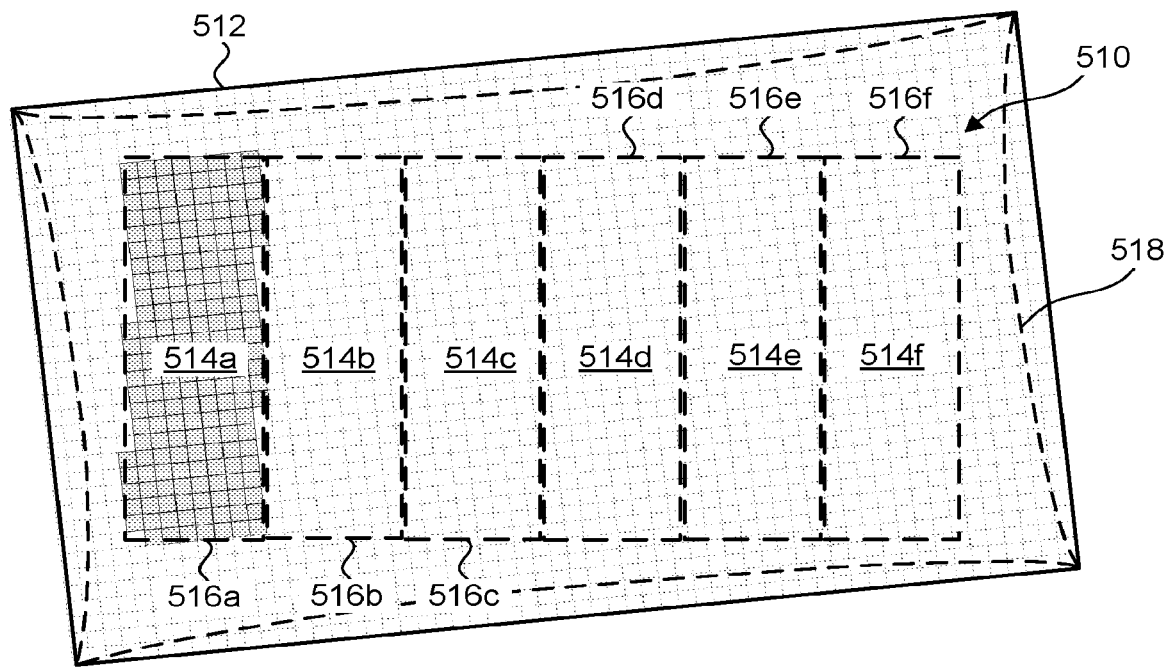
FIG. 5B is a simplified diagram illustrating overlapping field of views of an emitter array field of view and an image sensor array field of view whose corresponding emitter array and image sensor array are imperfectly aligned according to some embodiments of the present disclosure.

For instance, FIG. 5B is a simplified diagram illustrating overlapping field of views of an emitter array field of view 510 and an image sensor array field of view 512 whose corresponding emitter array and image sensor array are imperfectly aligned. Some embodiments of the invention can correct for this misalignment as described herein. For example, by having the physical dimensions, and thus field of view 512, of the image sensor array be larger than the physical dimensions, and thus field of view 510, of the emitter array, the entire emitter array field of view 510 can still overlap with at least a portion of image sensor array field of view 512 even if the image sensor array is positioned at an angle with respect to the emitter array, as shown in FIG. 5B. Even though image sensor array field of view 512 is angled, those image photosensors that correspond with the field of view of the emitter array can still be programmed to activate in synchronization with the emitter array. For instance, group of image photosensors associated with field of view group 514a can be configured to activate when control signal 1 is received, as shown in FIG. 5B. The angled arrangement can result in a grouping of image photosensors having jagged edges as an artifact of the angular mismatch between image sensor array field of view 512 and emitter array field of view 510.

The larger dimension also allows for some optical aberration tolerances. As an example, an imperfect bulk imaging optic can result in a degree of distortion of image sensor array field of view 512, which can cause the edges of the field of view to cave inward. However, because image sensor array field of view 512 is larger than emitter array field of view 510, the entire emitter array field of view 510 can still overlap with at least a portion of the image sensor array field of view 512, and the ability to capture images of the emitter array field of view 510 may not be negatively impacted.

B. Synchronization and Timing of Image Photosensors

Figure 6:
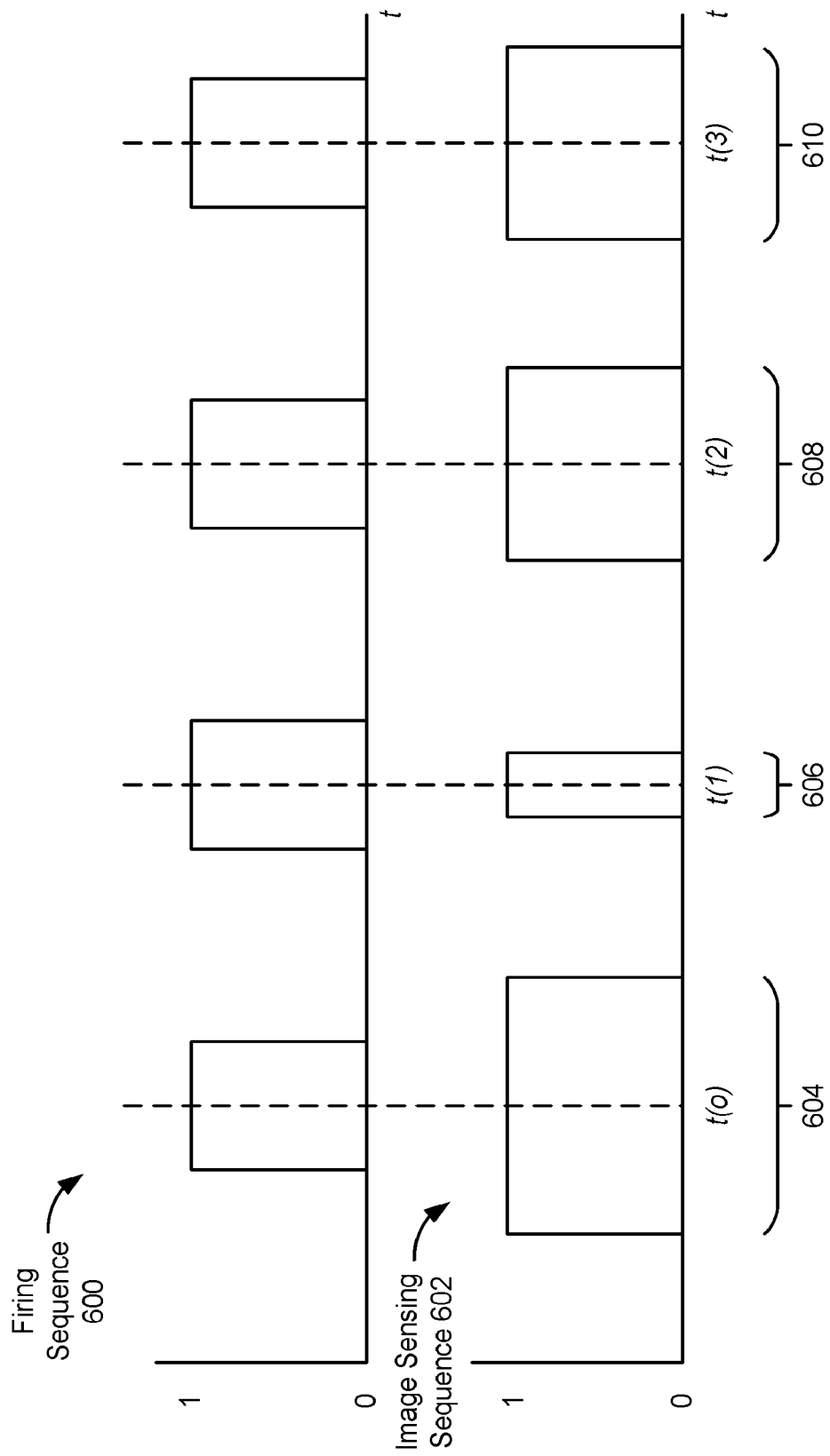
FIG. 6 is a timing diagram illustrating the synchronization of an image sensor array with an emitter array according to some embodiments of the present disclosure.

As discussed herein, the activation of image photosensors in an image sensor array can be synchronized with the firing of emitters in an emitter array and the activation of TOF photosensors in the TOF sensor array. Furthermore, in some embodiments, the exposure of the synchronized image photosensors can be modified between activation periods to achieve the optimum exposure time. FIG. 6 is a timing diagram illustrating the synchronization of an image sensor array with a TOF sensor array, according to some embodiments of the present disclosure. A TOF exposure sequence 600 represents the temporal activation of banks of TOF photosensors in the TOF sensor array (as well as the firing of corresponding banks of emitters in the emitter array), and an image sensing sequence 602 represents the temporal activation of the corresponding groups of image photosensors in the image sensor array. As shown in FIG. 6, four banks of TOF photosensors can be activated at four respective times, e.g., at each time t(0)-t(3), and their duration of activation can each be centered around their respective time t(0)-t(3). In some embodiments, the synchronized activation of the image sensor array can be configured so that its corresponding activation is also centered around times t(0)-t(3). Accordingly, the activation rate of the image sensor array can be equal to the activation rate of the TOF sensor array. However, it is to be appreciated that the activation rate of the image sensor array can be substantially higher than the activation rate of the TOF sensor array, especially in embodiments where the image sensor array has a high shutter speed, as will be discussed further herein with respect to FIGS. 7A-7C.

In certain embodiments, image sensor array can be controlled to modify its exposure time between each activation so that the exposure time can be tuned so that the image photosensors receive an optimum amount of light. The exposure time can be defined by the duration of each activation. For instance, the activation of a first, second, third, and fourth group of image photosensors can have a first, second, third, and fourth exposure 604, 606, 608, and 610, respectively. The brightness of a previous activation can be used to modify the exposure for a subsequent activation. As an example, if the previous activation was too bright, then the exposure for the subsequent activation can be decreased, and vice versa. For instance, as shown in FIG. 6, the image sensor controller can determine that the light sensed during the activation of the first group of image photosensors was too bright; thus, exposure 606 for the second group of image photosensors can be decreased. The image sensor controller can then determine that the light sensed during the activation of the second group of image photosensors was too bright, and thus increase exposure 608 for the third group of image photosensors. Afterwards, the image sensor controller can determine that the light sensed during the activation of the third group of image photosensors was just right, and thus keep the exposure 610 the same and for each activation thereafter until the entire image sensor array is activated.

As mentioned herein, embodiments are not limited to configurations where the activation rate of the image sensor array is equal to the activation rate of the emitter array, and that some embodiments can be configured with an image sensor array designed as a global shutter that has a high shutter speed where the activation rate of the image sensor array is greater than the activation rate of the emitter array. FIG. 7A is a timing diagram illustrating the synchronization of an image sensor array with a TOF sensor array (and thus with the firing of the emitters of an emitter array) where the activation rate of the image sensor array is a multitude higher than the activation rate of the TOF sensor array, according to some embodiments of the present disclosure. An activation sequence 700 represents the temporal activation of banks of TOF photosensors in the TOF sensor array, and an image sensing sequence 702 represents the temporal activation of the entire array of image photosensors in the image sensor array.

Like FIG. 6, four banks of TOF photosensors can be activated at four separate times, e.g., at each time t(0)-t(3), and their duration of activation can each be centered around a corresponding time t(0)-t(3). Conversely, unlike FIG. 6, image sensing sequence 702 can have a substantially higher activation rate so that the image sensor array activates more times that the TOF sensor array for a given time period. Accordingly, not every activation of the image sensor array will be synchronized with a corresponding activation of the TOF sensor array. For example, the image sensor array can be activated four times between sequential firings of the TOF sensor array, as shown in FIG. 7A (i.e., the frame rate of the image sensor array in FIG. 7A is five times faster than the frame rate of the TOF sensor array, which is matched to the rate at with the emitters are fired). The high activation rate of the image sensor array can result in a decrease in the exposure time for each activation. However, the image sensor controller can be configured to take advantage of the additional activations of the image sensor array to improve the exposure of the captured image. For instance, as shown in FIG. 7B, the image sensor controller can receive image data for three activations 706a-c to capture the image of the field of view during a single activation 704 of a bank of TOF photosensors. The time at which the three activations 706a-c occur can be centered around time t(1) at which the bank of TOF photosensors is activated. Image data from more or less numbers of activations can be received to capture an image of the field of view. As an example, as shown in FIG. 7C, the image sensor controller can receive image data from two activations 708a-b in addition to activations 706a-c for a total of five activations to capture the image of the field of view during a single activation 704 of a bank of TOF photosensors. The time at which the five activations occur can be centered around time t(1) at which the bank of TOF photosensors is activated.

III. Enhanced Light Emission System for Light Ranging

Some embodiments of the present disclosure pertain to a LIDAR sensor that can, among other uses, be used for obstacle detection and avoidance in autonomous vehicles. Some specific embodiments pertain to LIDAR sensors that include design features that enable the sensors to be manufactured cheaply enough and with sufficient reliability and to have a small enough footprint to be adopted for use in mass-market automobiles, trucks and other vehicles. For example, some embodiments include a set of vertical-cavity surface-emitting lasers (VCSELs) as illumination sources that emit radiation into a field and include arrays of single-photon avalanche diode (SPAD) detectors as a set of TOF photosensors (detectors) that detect radiation reflected back from a surface in the field. Using VCSELs as the emitters and SPADs as the detectors enables multiple measurements to be taken at the same time (i.e., the VCSEL emitters can be fired simultaneously) and also enables the set of emitters and the set of TOF photosensors to each be fabricated using standard CMOS processes on a single chip, greatly simplifying the manufacturing and assembly process.

Using VCSELs and SPADs in certain embodiments presents challenges, however, that various embodiments of the present disclosure overcome. For example, VCSELs are much less powerful than typical lasers used in existing LIDAR architectures and SPADs are much less efficient than the typical detectors used in the existing LIDAR architectures. To address these challenges, as well as challenges presented by firing multiple emitters simultaneously, certain embodiments of the disclosure include various optical components (e.g., lenses, filters, and an aperture layer), which may work in concert with multiple arrays of SPADs, each array corresponding to a different pixel (e.g., position in the field), as described herein. For example, as discussed herein with respect to FIG. 1, optical system 128 of light sensing module 108 can include a micro-optic receiver layer (not shown in FIG. 1) for enhancing the light detected by TOF sensor array 126, which can include an array of TOF photosensors, each of which can be an array of SPADs.

Figure 8:
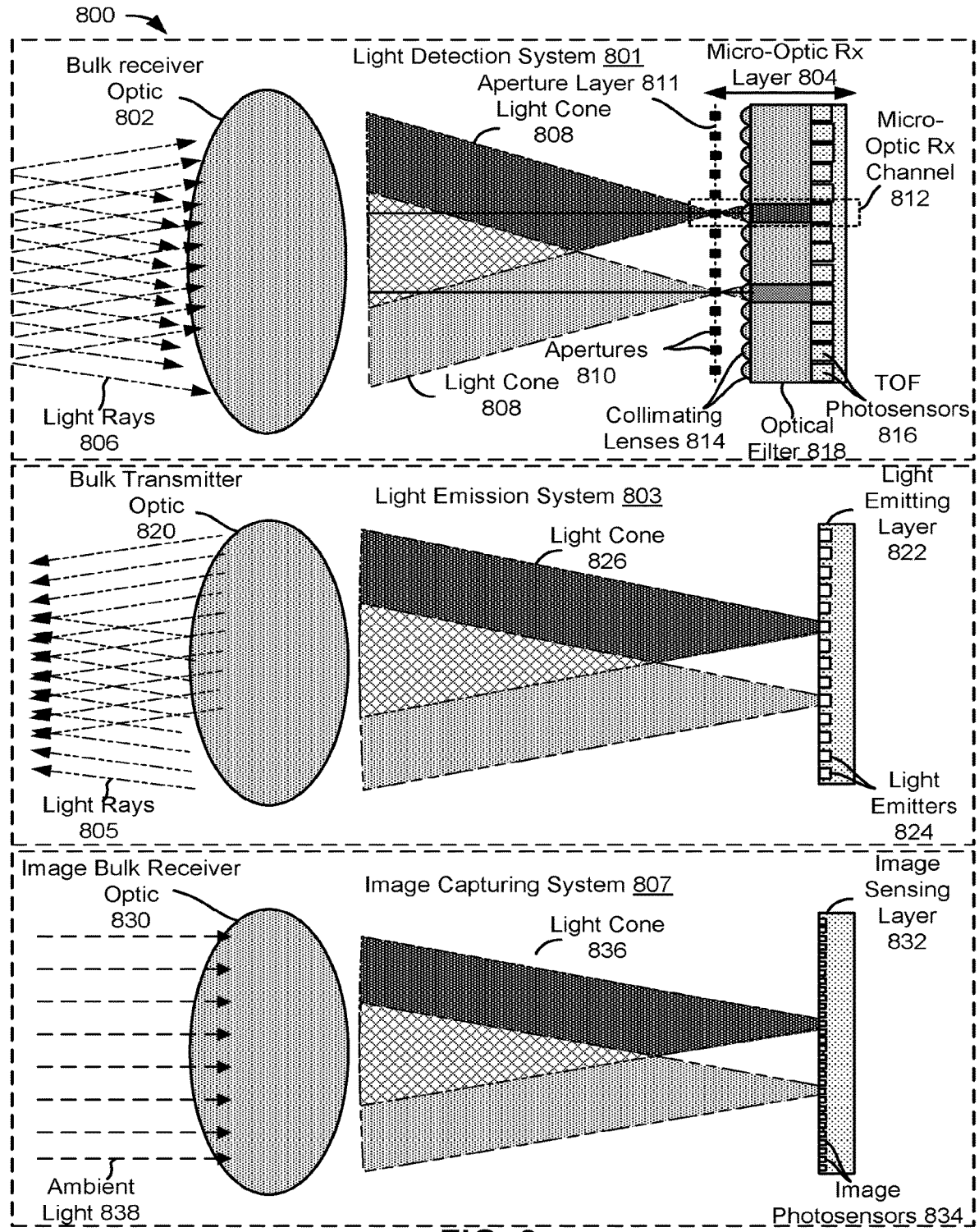
FIG. 8 is a simplified diagram illustrating a detailed side-view of an exemplary solid state electronic scanning LIDAR system according to some embodiments of the invention.

FIG. 8 is a simplified diagram illustrating a detailed side-view of an exemplary solid state electronic scanning LIDAR system 800, according to some embodiments of the present disclosure. Solid state electronic scanning LIDAR system 800 can include a light detection system 801, a light emission system 803, and an image capturing system 807. Light emission system 803 provides active illumination of at least a portion of a field in which system 800 is positioned with narrowband light rays 805. Light detection system 801 detects the narrowband light emitted from the light emission system 803 after it has been reflected by objects in the field as reflected light rays 806. Image capturing system 807 detects ambient light in the visible spectrum existing in the portion of the field in which light emission system 803 emits light.

Light detection system 801 can be representative of light detection system 136 discussed above with respect to FIG. 1. Light detection system 801 can include an optical sensing system and a TOF sensor array. The optical sensing system can include bulk receiver optics, an aperture layer, a collimating lens layer, and an optical filter layer; and the TOF sensor array can include an array of TOF photosensors, where each TOF photosensor can include one or more photodetectors for measuring light. According to some embodiments, these components operate together to receive light from a field. For instance, light detection system 801 can include a bulk receiver optic 802 and a micro-optic receiver (Rx) layer 804. During operation, light rays 806 enter bulk receiver optic 802 from multiple directions and gets focused by bulk receiver optic 802 to form light cones 808. Micro-optic receiver layer 804 is positioned so that apertures 810 coincide with the focal plane of bulk receiver optic 802. In some embodiments, micro-optic receiver layer 804 can be a two-dimensional array of micro-optic receiver channels 812, where each micro-optic receiver channel 812 is formed of a respective aperture 810, collimating lens 814, and TOF photosensor 816 positioned along the same axis in the direction of light transmission, e.g., horizontal from left to right as shown in FIG. 8. Furthermore, each micro-optic receiver channel 812 can be configured various ways to mitigate interference from stray light between TOF photosensors, as will be discussed further herein. During operation, each micro-optic receiver channel 812 measures light information for a different pixel (i.e., position in the field).

At the focal point of bulk receiver optic 802, light rays 806 focus and pass through apertures 810 in an aperture layer 811 and into respective collimating lenses 814. Each collimating lens 814 collimates the received light so that the light rays all enter the optical filter at approximately the same angle, e.g., parallel to one another. The aperture and focal length of bulk receiver optic 802 determine the cone angle of respective light rays that come to a focus at aperture 810. The aperture size and the focal length of collimating lenses 814 determine how well-collimated the admitted rays can be, which determines how narrow of a bandpass can be implemented in optical filter 818. The aperture layer can serve various functions during the operation of light detection system 800. For instance, (1) apertures 810 can constrain the pixel field of view so it has tight spatial selectivity despite a large pitch at the TOF photosensor plane, (2) apertures 810 can constrain the field of view to be similar or equal in size to the emitter field of view for efficient use of emitter light, (3) the apertures can provide a small point-like source at the collimating lens's focal plane to achieve tight collimation of rays before passing through the filter, where better collimation results in a tighter band that can pass through the filter, and (4) the stop region of the aperture layer surrounding each aperture can reject stray light. In some embodiments, collimating lenses 814 are not included, and the bandpass filter passband is less narrow.

Optical filter 818 blocks unwanted wavelengths of light. Interference-based filters tend to exhibit strong angle dependence in their performance. For example, a 1 nm wide bandpass filter with a center wavelength (CWL) of 900 nm at a zero-degree angle of incidence might have a CWL of 898 nm at a fifteen-degree angle of incidence. Imaging systems typically use filters several tens of nanometers wide to accommodate this effect, so that the shift in CWL is much smaller than the bandpass width. However, the use of micro-optic layer 804 allows all rays to enter optical filter 818 at approximately the same angle of incidence, thus minimizing the shift in CWL and allowing very tight filters (e.g. less than 8 nm wide) to be used. TOF photosensor 816 generates electrical currents or voltages in response to incident photons. In some embodiments, optical filter 818 is uniform across the entire array of micro-optic receiver channels 812 so that each individual micro-optic receiver channel 812 in the array receives the same range of wavelengths of light.

In some embodiments, TOF photosensors 816 are positioned on a side opposite of collimating lenses 814 so that light rays 806 first pass through collimating lenses 814 and optical filter 818 before exposing on TOF photosensors 816. Each TOF photosensor 816 can be a plurality of photodetectors, such as a mini-array of multiple single-photon avalanche detectors (SPADs). An array of mini-arrays of SPADs can be fabricated on a single monolithic chip, thereby simplifying fabrication. In some alternative embodiments, each TOF photosensor 816 can be a single photodetector, e.g., a standard photodiode, an avalanche photodiode, a resonant cavity photodiode, or another type of photodetector.

Light emission system 803 can include a bulk transmitter optic 820 and a light emitting layer 822 formed of a two-dimensional array of light emitters 824. Each light emitter 824 can be configured to generate discrete beams of narrowband light. In some embodiments, light emitting layer 822 is configured to selectively project the discrete beams of light through bulk transmitter optic 820 according to an illumination pattern that matches, in size and geometry across a range of distances from light emission system 803, the fields of view of the receiver channels in micro-optic receiver layer 804. Light emitters 824 can be any suitable light emitting device, such as a vertical-cavity surface-emitting lasers (VCSELS) integrated on one or more monolithic chip, or any other type of laser diode. Light emitters 824 can produce cones of narrowband light 826 that are directed to bulk transmitter optic 820, which can collimate cones of light 826 and then output the collimated light to distant targets in the field as emitted light rays 805. In some embodiments, bulk transmitter optic 820 is image-space telecentric.

As is evident from the illustration of parallel light rays 805 and 806 in FIG. 8, each micro-optic receiver channel 812 has a non-overlapping field of view beyond a threshold distance. As shown in FIG. 8, each micro-optic receiver channel 812 includes an aperture from the plurality of apertures, a lens from the plurality of lenses, and a photodetector from the plurality of photodetectors, where the aperture of each channel defines a discrete field of view for the pixel in the channel that is non-overlapping beyond a threshold distance within the fields of view of the other micro-optic receiver channels. That way, each micro-optic receiver channel receives reflected light corresponding to a discrete position in the field that is not measured by any other micro-optic receiver channel in micro-optic receiver layer 804.

In additional and alternative embodiments, light rays 805 from light cones 826 are focused on an intermediate plane in space by a micro-optic transmitter layer (not shown) before being directed to distant targets by the bulk transmitter optic 820 to enhance the brightness and intensity of light emitted from light emission system 803. In such embodiments, embodiments, light emission system 803 and light detection system 801 are configured such that each micro-optic transmitter channel (not shown) is paired with a corresponding micro-optic receiver layer 804 and the centers of their fields-of-view are aligned to be overlapping at a certain distance from the sensor or their chief rays are made parallel. In further additional and alternative embodiments, the far-field beams of light emitted by light emission system 803 are of similar size and divergence angle to the far-field fields-of-view of each micro-optic receiver layer 804. Details of light emission systems 803 having the micro-optic transmitter layer for enhancing brightness and intensity of outputted light will be discussed in detail below.

Because VCSELs are less powerful than typical lasers in some existing LIDAR architectures, in some embodiments, light emission system 803 can be configured to improve the ability of LIDAR system 800 to perform light ranging functionality. That is, the quality of light emitted by light emission system 803 can be enhanced to improve light ranging accuracy and efficiency. The quality of transmitted light for light ranging and imaging purposes can be defined in terms of brightness and intensity. The brightness and intensity of light rays emitted from bulk transmitter optic 820 can be enhanced by modifying and/or implementing one or more optic transmitter layers.

Image capturing system 807 can be representative of image capturing system 156 discussed above with respect to FIG. 1. Image capturing system 807 can include a bulk image receiver optic 830 and an image sensing layer 832 formed of a two-dimensional array of image photosensors 834. Each image photosensor 834 can be configured to detect ambient light in the visible wavelength spectrum existing in the scene. Bulk image receiver optic 830 can focus down incoming ambient light 838 as light code 836 onto image sensing layer 832 so that image photosensors 834 can detect ambient light 838. In some embodiments, image bulk receiver optic 830 is image-space telecentric. Image sensing layer 832 can be any suitable visible light sensor, such as a charged coupled device (CCD) sensor or a complementary metal-oxide-semiconductor (CMOS) image sensor.

Figure 9:
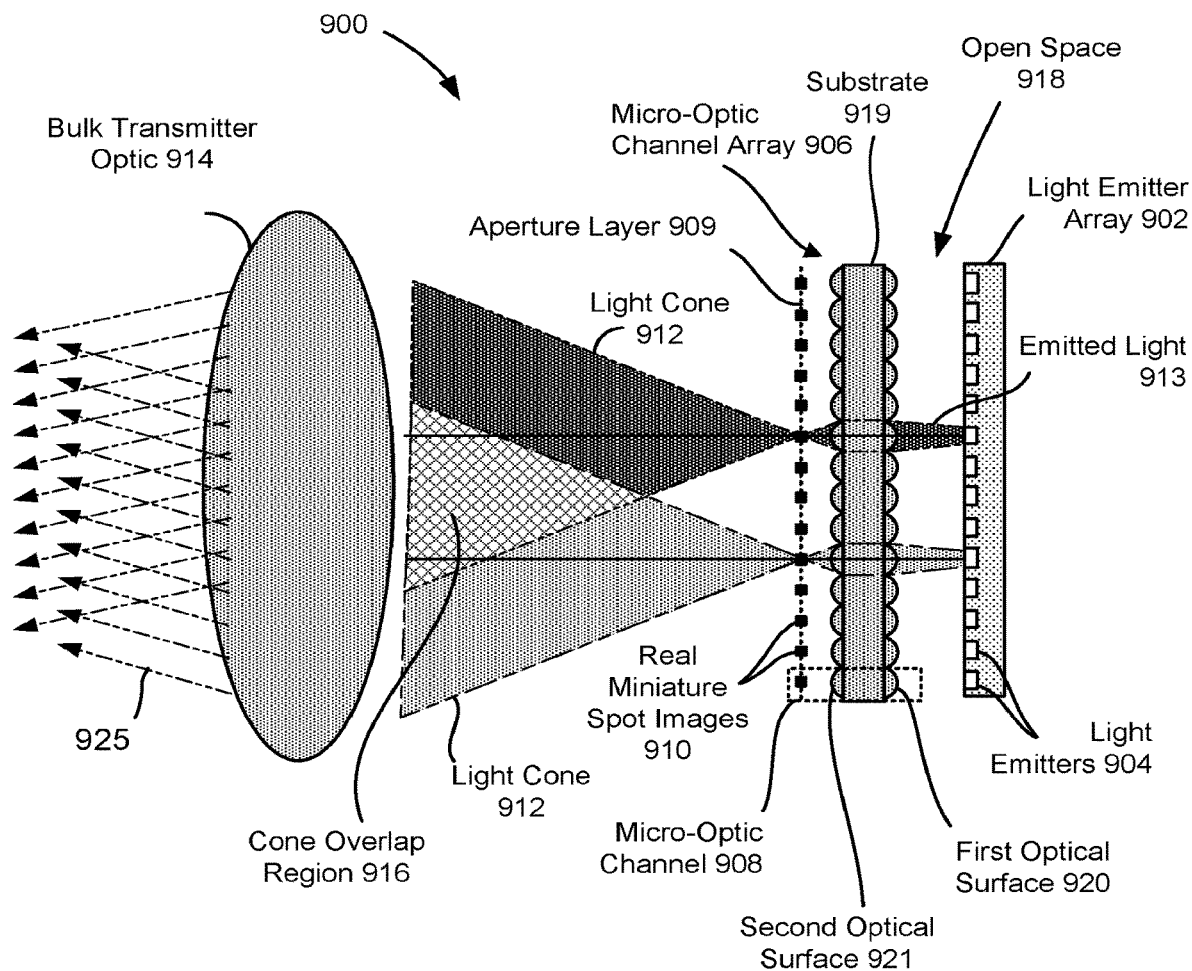
FIG. 9 is a simplified cross-sectional view diagram of an exemplary enhanced light emission system according to some embodiments of the invention.

FIG. 9 is a simplified cross-sectional view diagram of an exemplary enhanced light emission system 900, according to some embodiments of the present disclosure. Light emission system 900 can include a light emitter array 902 having light emitters 904 that for example may comprise without limitation any of LEDs, laser diodes, VCSELs, or the like for emitting light 913. A VCSEL is a type of semiconductor laser diode with laser beam emission perpendicular from the top surface. Note that the linear array shown in FIG. 9 can be any geometric form of emitter array, including and without limitation circular, rectangular, linear, or any other geometric shape.

Enhanced light emission system 900 can include a micro-optic transmitter channel array 906 separated from light emitter array 902 by an open space 918. Each micro-optic transmitter channel 908 can be paired with a corresponding receiver channel (e.g., receiver channel 512 in FIG. 5) and the centers of their fields-of-view are aligned to be overlapping at a certain distance from the optical imager system. Micro-optic transmitter channel array 906 can be formed of a substrate 919 sandwiched between a first optical surface 920 positioned on a side facing light emitter array 902 and a second optical surface 921 positioned on an opposite side facing away from light emitter array 902. Both first and second optical surfaces 920 and 921 can each be configured as an array of convex, micro-optic lenses where each convex lens of first optical surface 920 is configured to be optically aligned with a respective convex lenses of second optical surface 920 so that light transmitting through first optical surface 920 can subsequently be transmitted through second optical surface 921. The corresponding convex lenses from first and second optical surfaces 920 and 921 can face away from one another as shown in FIG. 9. In certain embodiments, convex lenses of first optical surface 920 have a first optical power and convex lenses of second optical surface 921 have a second optical power different from the first optical power. For instance, the second optical power can be greater than the first optical power such that the focal length of the second optical power is shorter than the focal length of the first optical power. Substrate 919 can be formed of any suitable material that is transmissive in the wavelength range of the light emitters 904 such silicon, silicon dioxide, borosilicate glass, polymer, and the like. First and second optical surfaces 920 and 921 can be formed of a transparent polymer that is imprinted on respective opposite surfaces of substrate 919.

In some embodiments, micro-optic transmitter channel array 906 can be formed of a monolithic array of micro-optic transmitter channels 908. Each micro-optic transmitter channel 908 can include a first convex lens from first optical surface 920, a corresponding second convex lens from second optical surface 921, and a corresponding portion of substrate 919 positioned between the two convex lenses. Each micro-optic transmitter channel 908 can correspond with a respective light emitter 904 so that light outputted from the light emitter 904 first passes through the first convex lens, through the corresponding region of substrate 919, and then through the second convex lens during operation.

Once light emits out of the second convex lens of second optical surface 921, the light forms a miniature spot image 910 that is a real image of the corresponding light emitter 904 but a reduced-size of the corresponding light emitter 904. In some embodiments, miniature spot images 910 are positioned between micro-optic transmitter channel array 906 and bulk transmitter optic 914. For instance, miniature spot images 910 can be formed within respective apertures of an aperture layer 909. Each aperture can be a pin hole in a reflective or opaque layer in which emitted light focuses to form miniature spot images 910. It is to be appreciated that aperture layer 909 is optional and light enhancing capabilities of micro-optic transmitter channel array 906 can be achieved without aperture layer 909. In such embodiments, miniature spot images 910 can be formed at a focal plane of the second convex lens of second optical surface 921. From there, continuing away from both the light emitter and micro optic channel, the light forms a light cone 912 reaching out towards bulk transmitter optic 914.

According to some embodiments of the present disclosure, the degree of divergence of emitted light 913 can be smaller than the degree of divergence of light cone 912. This discrepancy in divergence can be created by a micro-optic transmitter channel 908, specifically by the optical power of second optical surface 921. Because the divergence of light out of micro-optic transmitter channel 908 is larger than the divergence of emitted light 913 from light emitters 904, miniature spot image 910 can be a real image of light emitter 904 but a multitude smaller than the size of light emitter 904 and with the same number of photons as emitted light 913. The resulting light cone 912 formed after the real spot images are formed then gets projected into the field as discrete beams of light 925 for each light emitter 904 after passing through bulk transmitter optic 914. The resulting light rays emanating out of light emission system 900 are highly collimated beams of light 925 that have a small cross-sectional area, thereby resulting in a light emission system 900 that can output light having enhanced brightness and intensity. In contrast, a system with no micro-optic channel array that instead has light emitter array 902 at the focal plane of bulk transmitter optic 914 would produce beams that are significantly less collimated, and these beams would therefore have a larger cross-sectional area in the far field.

Note that bulk transmitter optic 914 can include either a single lens or a cluster of lenses where two or more lenses function together to form bulk transmitter optic 914. The use of multiple lenses within the bulk transmitter optic 914 could increase the numerical aperture, reduce the RMS spot size, flatten the image plane, improve the telecentricity, or otherwise improve the performance of bulk transmitter optic 914. Note also that for some embodiments, light cones 912 may overlap forming cone overlap region 916.

Bulk transmitter optic 914 is positioned in front of the micro-optic and emitting layers such that the focal plane of the bulk imaging optic coincides with miniaturized spot images 910. Bulk transmitter optic 914 accepts divergent light cone(s) 912 and outputs a collimated beam. Its numeric aperture can be at least large enough to capture the full range of angles in the divergent ray cone(s). Also, bulk transmitter optic 914 can be image-space telecentric, since light cone(s) 912 exiting the micro-optic layer may all be parallel (rather than having their center axes aimed towards the center of the bulk optic). In one embodiment, light can exit bulk transmitter optic 914 approximately collimated. Note that the quality of beam collimation relates to the size of the "emitting object" (miniature spot images 910) at the focal plane. Since this "emitting object" size has been reduced by using a micro-optic stack, a better collimation angle is obtained than if the emitter object was simply imaged directly.

Although FIG. 9 shows an enhanced light emission system having a micro-optic channel array formed of a substrate sandwiched between first and second optical surfaces, and positioned a distance away from a light emitter array by an open space to improve the brightness and intensity of light outputted by the light emission system, embodiments are not limited to such configurations. Rather, other embodiments may not necessarily implement an open space or two optical surfaces, as discussed in further detail in related U.S. patent application Ser. No. 15/979,235, entitled "Optical Imaging Transmitter with Brightness Enhancement", filed on May 14, 2018, and incorporated herein by reference in its entirety for all purposes.

Although embodiments discuss image capturing modules for electronically scanning emitter arrays, embodiments are not limited to such configurations. In some embodiments, image capturing modules can be implemented in LIDAR systems that mechanically scan light emissions, such as with a mirror galvanometer. Such systems can scan a two-dimensional array of laser beams along a predetermined scan pattern using the mirror galvanometer. Accordingly, a light sensing module and an image capturing module can be configured to capture images of the scene that coincide with the scan pattern of the laser beam.

Figure 11:
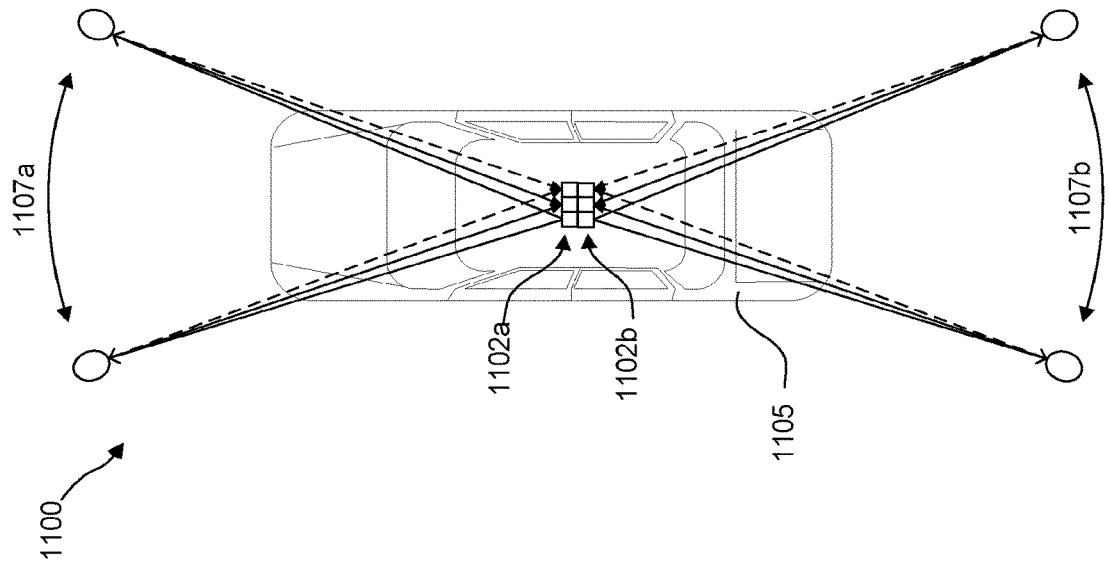
FIG. 11 is a simplified illustration of solid state electronic scanning LIDAR systems implemented on top of a road vehicle according to some embodiments of the invention.

In some embodiments, multiple electrical scanning LIDAR units according to the present disclosure can work together to provide a larger field of view than a single unit. For example, FIG. 10 illustrates an implementation 1000 where solid state electronic scanning LIDAR systems 1002a-d are implemented at the outer regions of a road vehicle 1005, such as an automobile, according to some embodiments of the present disclosure; and FIG. 11 illustrates an implementation 1100 where solid state electronic scanning LIDAR systems 1102a-b are implemented on top of a road vehicle 1105, according to some embodiments of the present disclosure. In each implementation, the number of LIDAR systems, the placement of the LIDAR systems, and the fields of view of each LIDAR system can be chosen to obtain a majority of, if not the entirety of, a 360 degree field of view of the environment surrounding the vehicle. Automotive implementations for the LIDAR systems are chosen herein merely for the sake of illustration and the sensors described herein may be employed in other types of vehicles, e.g., boats, aircraft, trains, etc., as well as in a variety of other applications where 3D depth images are useful, such as medical imaging, mobile phones, augmented reality, geodesy, geomatics, archaeology, geography, geology, geomorphology, seismology, forestry, atmospheric physics, laser guidance, airborne laser swath mapping (ALSM), and laser altimetry.

With reference to FIG. 1000, solid state electronic scanning LIDAR systems 1002a-d can be mounted at the outer regions of a vehicle, near the front and back fenders. LIDAR systems 1002a-d can each be positioned at a respective corner of vehicle 1005 so that they are positioned near the outermost corners of vehicle 1005. That way, LIDAR systems 1002a-d can better measure the distance of vehicle 1005 from objects in the field at areas 1006a-d, as well as capture images of the objects in the field at areas 1006a-d. Emitted light and sensed reflected emitted light for ranging/3D imaging purposes are shown as solid lines while reflected ambient light for imaging (i.e., 2D imaging) purposes are shown as dotted lines. Each solid state LIDAR system can face a different direction (possibly with partially and/or non-overlapping field of views between units) so as to capture a composite field of view that is larger than each unit is capable of capturing on its own.

Figure 10:
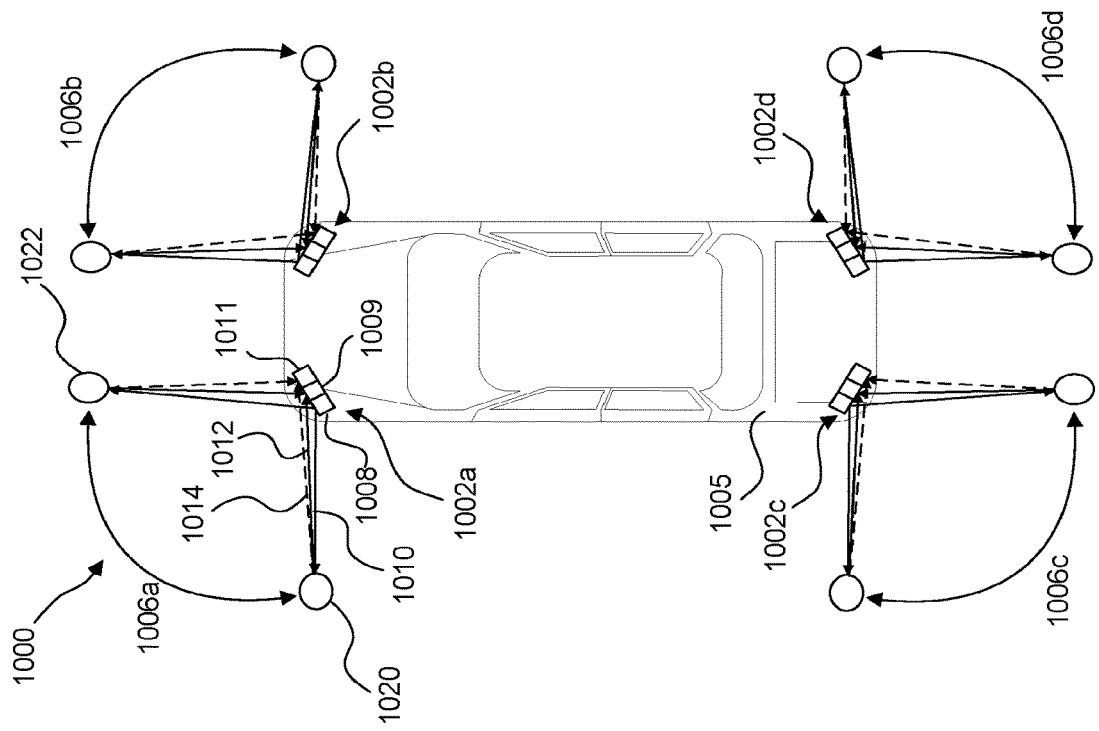
FIG. 10 is a simplified illustration of solid state electronic scanning LIDAR systems implemented at the outer regions of a road vehicle according to some embodiments of the invention.

As shown in FIG. 10, objects within the scene can reflect portions of light pulses 1010 that are emitted from LIDAR Tx module 1008. One or more reflected portions 1012 of light pulses 1010 then travel back to LIDAR system 1002a and can be received by Rx module 1009. Furthermore, ambient light 1014 reflected by objects within the scene can travel to LIDAR system 1002a and be received by IRx module 1011. Rx module 1009 and IRx module 1011 can be disposed in the same housing as Tx module 1008. As discussed herein, electronic scanning LIDAR systems 1002a-d can electronically scan a scene to capture images of the scene. Thus, LIDAR system 1002a can scan between points 1020 and 1022 to capture objects in the field at area 1006a, and likewise for systems 1002b-d and areas 1006b-d.

Although FIG. 10 illustrates four solid state electronic scanning LIDAR systems mounted at the four corners of a vehicle, embodiments are not limited to such configurations. Other embodiments can have fewer or more solid state electronic scanning LIDAR systems mounted on other regions of a vehicle. For instance, electronic scanning LIDAR systems can be mounted on a roof of a vehicle, as shown in FIG. 11. In such embodiments, electronic scanning LIDAR systems 1102a-b can have a higher vantage point to better observe areas 1107a-b around vehicle 1105. In some embodiments, the scanning can be implemented by other means, such as chip-based beam steering techniques, e.g., by using microchips that employ one or more MEMS based reflectors, such as a digital micromirror (DMD) device, a digital light processing (DLP) device, and the like.

As mentioned herein, the number of LIDAR systems, the placement of the LIDAR systems, and the fields of view of each LIDAR system can be chosen to obtain a majority of, if not the entirety of, a 360 degree field of view of the environment surrounding the vehicle. Accordingly, each LIDAR system 1002a-d can be designed to have a field of view of approximately 90 degrees so that when all four systems 1020a-d are implemented, a full or substantial majority of a 360 degree field of view around vehicle 1005 can be observed. In embodiments where each LIDAR system 1002a-d has less than a 90 degree field of view, such as a 45 degree field of view, additional LIDAR systems can be included as desired to extend the field of view to achieve a combined field of view as may be required by a particular implementation.

Although the present disclosure has been described with respect to specific embodiments, it will be appreciated that the present disclosure is intended to cover all modifications and equivalents within the scope of the following claims.

What is claimed is:

1. An electronically scanning optical system comprising:
   an emitter array comprising a plurality of light emitters configured to emit light at an operating wavelength into a field external to the optical system;
   a first sensor array comprising a plurality of depth photosensors configured to detect emitted light reflected back from the field;
   an optical filter disposed between the field and the first sensor array and operable to pass a narrow band of light that includes the operating wavelength to the first sensor array;
   a second sensor array comprising a plurality of image photosensors configured to detect ambient light in the field, wherein a field of view of the emitter array corresponds to a field of view of the first sensor array and at least a subset of a field of view of the second sensor array;
   an emitter controller coupled to the emitter array and configured to activate the plurality of light emitters in each emission cycle by activating a subset of the plurality of light emitters at a time;
   a first sensor controller coupled to the first sensor array and configured to synchronize a readout of individual depth photosensors within the first sensor array concurrently with a firing of corresponding light emitters in the emitter array such that each light emitter in the emitter array can be activated and each depth photosensor in the first sensor array can be readout through the emission cycle; and a second sensor controller coupled to the second sensor array and configured to readout at least a portion of the second sensor array having a field of view that overlaps with a field of view of the emitter array to capture an image that is representative of the field during the emission cycle.

2. The electronically scanning optical system of claim 1 wherein the operating wavelength is an infrared or near-infrared wavelength.

3. The electronically scanning optical system of claim 1 wherein in each instance in which the emitter controller activates a subset of the plurality of light emitters, the second sensor controller activates and reads out from a subset of image photosensors that share the field of view of the activated subset of light emitters.

4. The electronically scanning optical system of claim 1 wherein in each instance in which the emitter controller activates a subset of the plurality of light emitters, the second sensor controller activates the entire second sensor array but reads out from a subset of image photosensors that share the field of view of the activated subset of light emitters.

5. The electronically scanning optical system of claim 1 wherein each image photosensor in the second sensor array is configured to be activated individually, and the second sensor controller is configured to synchronize activation of groups of image photosensors concurrently with firing of corresponding banks of light emitters in a sequential order.

6. The electronically scanning optical system of claim 5 wherein a duration of a first activation of a first group of image photosensors is different from a duration of a second activation of a second group of image photosensors.

7. The electronically scanning optical system of claim 1 wherein the entire second sensor array is configured to be activated at a time, and the second controller is configured to synchronize the activation of the entire second sensor array and the readout of respective groups of image photosensors concurrently with the firing of corresponding banks of light emitters in a sequential order.

8. The electronically scanning optical system of claim 7 wherein an activation rate of the second sensor array of image photosensors is higher than an activation rate of the emitter array.

9. The electronically scanning optical system of claim 8 wherein the second sensor controller is configured to readout image data from more than one activation of the first sensor array and associate the readout image data with an activation of a corresponding bank of light emitters.

10. The electronically scanning optical system of claim 1 wherein field of view of the second sensor array is larger than the field of view of the emitter array.

11. The electronically scanning optical system of claim 1 wherein an overall dimension of the second sensor array of image photosensors is larger than an overall dimension of the emitter array of light emitters.

12. The electronically scanning optical system of claim 1 further comprising an aperture layer having a plurality of apertures and wherein the aperture layer and first sensor array of depth photosensors are arranged to form a plurality of receiver channels with each receiver channel in the plurality of receiver channels including an aperture from the plurality of apertures and a depth photosensor from the first sensor array of depth photosensors with the aperture defining the field of view of the depth photosensor in the receiver channel.

13. The electronically scanning optical system of claim 1 wherein an activation of the image photosensors is temporally centered with respect to a respective firing of the corresponding light emitters.

14. A solid state optical system comprising:
an emitter array comprising a plurality of light emitters configured to emit discrete beams of light at an operating wavelength into a field external to the optical system according to an illumination pattern;

a lidar sensor array comprising a first plurality of photosensors operable to detect light emitted from the emitter array and reflected back from a field external to the solid state optical system, wherein each photosensor in the first plurality of photosensors has a discrete field of view in the field that is non-overlapping beyond a threshold distance from the optical system with the fields of view of the other photosensors in the first plurality of photosensors and wherein the field of view of the lidar sensor array substantially matches, in size and geometry across a range of distances from the system the illumination pattern of the emitter array;

an image sensor array comprising a second plurality of photosensors configured to detect ambient light in the field, wherein the discrete fields of view of each photosensor in the first plurality of photosensors defines a field of view of the lidar sensor array and wherein a field of view of the image sensor array encompasses the field of view of the lidar sensor array;

an emitter controller coupled to the emitter array and configured to activate every emitter in the plurality of light emitters in each emission cycle by activating a subset of the plurality of light emitters at a time;

a lidar sensor controller coupled to the lidar sensor array and configured to synchronize a readout of individual photosensors within the first plurality of photosensors concurrently with a firing of corresponding light emitters in the emitter array such that each light emitter in the emitter array can be activated and each photosensor in the first sensor array can be readout through the emission cycle; and an image sensor controller coupled to the image sensor array and configured to readout at least a portion of the image sensor array having a field of view that overlaps with a field of view of the emitter array to capture an image that is representative of the field during the emission cycle.

15. The solid state optical system of claim 14 wherein in each instance in which the emitter controller activates a subset of the plurality of light emitters, the image sensor controller activates and reads out from a subset of photosensors in the second plurality of photosensors that share the field of view of the activated subset of light emitters.

16. The solid state optical system of claim 14 wherein in each instance in which the emitter controller activates a subset of the plurality of light emitters, the image sensor controller activates all the photosensors in the second plurality of photosensors but reads out from only a subset of photosensors in the second plurality of photosensors that share the field of view of the activated subset of light emitters.

17. The solid state optical system of claim 14 wherein groups of photosensors in the second plurality of photosensors can be activated independently and the image sensor controller is operable to activate and synchronize groups of photosensors within the second plurality of photosensors concurrent with the firing of corresponding banks of light emitters in a predetermined order.

18. The solid state optical system of claim 14 wherein all the photosensors in the second plurality of photosensors are activated simultaneously, the image sensor controller is configured to synchronize the activation of the entire array of image photosensors and the readout of respective groups of image photosensors concurrently with the firing of corresponding banks of light emitters in a sequential order, and an activation rate of the image sensor array is higher than an activation rate of the emitter array.

19. The solid state optical system of claim 14 further comprising an aperture layer having a plurality of apertures and wherein the aperture layer and the lidar array are arranged to form a plurality of receiver channels with each receiver channel in the plurality of receiver channels including an aperture from the plurality of apertures and a photosensor from first plurality of photosensors with the aperture defining a field of view of the photosensor in the receiver channel.

20. A solid state optical system comprising:
- a light detection system comprising a first bulk optic having a focal length, an aperture layer including a plurality of apertures spaced apart from the first bulk optic by the focal length, a lidar sensor array comprising a first plurality of photosensors, a lens layer including a plurality of lenses disposed behind the aperture layer, and an optical filter operable to pass a narrow band of light centered at a first wavelength and disposed between the first bulk optic and the lidar sensor array, wherein the aperture layer, lens layer and lidar sensor array are arranged to form a plurality of lidar channels with each lidar channel in the plurality of lidar channels including an aperture from the plurality of apertures, a lens from the plurality of lenses and a photosensor from the first plurality of photosensors, and wherein each photosensor in the first plurality of photosensors comprises a plurality of single photon avalanche diodes (SPADs) and each lidar channel in the plurality of lidar channels defines a discrete field of view in a field ahead of the optical system that is non-overlapping beyond a threshold distance from the optical system with all other lidar channels in the plurality of lidar channels and wherein each lidar channel communicates light incident on the first bulk optic to the plurality of SPADs of the lidar channel;
- an image capturing system comprising a second bulk optic and an image sensor array comprising a second plurality of photosensors operable to detect ambient light in the field received through the second bulk optic, wherein the discrete fields of view of each photosensor in the first plurality of photosensors defines a field of view of the lidar sensor array and wherein a field of view of the image sensor array encompasses the field of view of the lidar sensor array;
- a light emission system comprising a third bulk optic and an emitter array comprising a plurality of vertical-cavity surface-emitting lasers (VCSELs) each of which is configured to emit a discrete beam of light at the first wavelength through the third bulk optic into a field external to the optical system such that the emitter array outputs a plurality of discrete beams of light according to an illumination pattern that substantially matches, in size and geometry across a range of distances from the system, the field of view of the lidar sensor array;
- an emitter controller coupled to the emitter array and configured to activate the plurality of VCSELs in each emission cycle by activating a subset of the plurality of light emitters at a time;
- a lidar sensor controller coupled to the lidar sensor array and configured to synchronize a readout of individual photosensors within the first plurality of photosensors concurrently with a firing of corresponding light emitters in the emitter array such that each light emitter in the emitter array can be activated and each photosensor in the first plurality of photosensors can be readout through the emission cycle; and
- an image sensor controller coupled to the image sensor array and configured to readout at least a portion of the image sensor array having a field of view that overlaps with a field of view of the emitter array to capture an image that is representative of the field during the emission cycle.

* * * * *